(12) United States Patent
Takeuchi et al.

(10) Patent No.: US 11,107,911 B2
(45) Date of Patent: Aug. 31, 2021

(54) SEMICONDUCTOR DEVICE AND METHOD FOR MANUFACTURING SAME

(71) Applicant: DENSO CORPORATION, Kariya (JP)

(72) Inventors: Yuichi Takeuchi, Kariya (JP); Shuhei Mitani, Kariya (JP); Yasuhiro Ebihara, Kariya (JP); Yusuke Yamashita, Nagakute (JP); Tadashi Misumi, Toyota (JP)

(73) Assignee: DENSO CORPORATION, Kariya (JP)

( * ) Notice: Subject to any disclaimer, the term of this patent is extended or adjusted under 35 U.S.C. 154(b) by 17 days.

(21) Appl. No.: 16/729,733

(22) Filed: Dec. 30, 2019

(65) Prior Publication Data

US 2020/0161467 A1   May 21, 2020

Related U.S. Application Data

(63) Continuation of application No. PCT/JP2018/023652, filed on Jun. 21, 2018.

(30) Foreign Application Priority Data

Jul. 7, 2017 (JP) ................................ 2017-133917
Apr. 9, 2018 (JP) ............................. JP2018-074816

(51) Int. Cl.
*H01L 21/00* (2006.01)
*H01L 29/78* (2006.01)
*H01L 29/16* (2006.01)
*H01L 29/06* (2006.01)
*H01L 29/66* (2006.01)

(52) U.S. Cl.
CPC ...... *H01L 29/7803* (2013.01); *H01L 29/0615* (2013.01); *H01L 29/1608* (2013.01); *H01L 29/66734* (2013.01)

(58) Field of Classification Search
CPC ............ H01L 29/7803; H01L 29/0615; H01L 29/1608; H01L 29/66734
See application file for complete search history.

(56) References Cited

U.S. PATENT DOCUMENTS

| | | | | |
|---|---|---|---|---|
| 6,455,892 B1* | 9/2002 | Okuno | ............. | H01L 29/66068 257/328 |
| 6,551,865 B2* | 4/2003 | Kumar | ............... | H01L 29/8083 257/134 |
| 2005/0029589 A1* | 2/2005 | Takahashi | .......... | H01L 29/7816 257/343 |

(Continued)

FOREIGN PATENT DOCUMENTS

JP       2018-049928 A    3/2018

*Primary Examiner* — Richard A Booth
(74) *Attorney, Agent, or Firm* — Posz Law Group, PLC

(57) ABSTRACT

A semiconductor device includes an inversion type semiconductor element, which has: a substrate; a drift layer; a saturation current suppression layer; a current dispersion layer; a base region; a source region; a connection layer; a plurality of trench gate structures; an interlayer insulation film; a source electrode; and a drain electrode. A channel region is provided in a portion of the base region in contact with each trench gate structure by applying a gate voltage to the gate electrode and applying a normal operation voltage as a drain voltage to the drain electrode; and a current flows between the source electrode and the drain electrode through the source region and the JFET portion.

17 Claims, 17 Drawing Sheets

(56) References Cited

U.S. PATENT DOCUMENTS

| | | |
|---|---|---|
| 2008/0001159 A1 | 1/2008 | Ota et al. |
| 2017/0263757 A1 | 9/2017 | Saikaku et al. |
| 2018/0315813 A1 | 11/2018 | Shiomi et al. |
| 2018/0331209 A1 | 11/2018 | Shiomi et al. |
| 2019/0288107 A1 | 9/2019 | Saikaku et al. |

* cited by examiner a manufacturing process of the SiC semiconductor device continued from FIG. 4C.
SEMICONDUCTOR DEVICE AND METHOD FOR MANUFACTURING SAME

CROSS REFERENCE TO RELATED APPLICATION

The present application is a continuation application of International Patent Application No. PCT/JP2018/023652 filed on Jun. 21, 2018, which designated the U.S. and claims the benefit of priority from Japanese Patent Applications No. 2017-133917 filed on Jul. 7, 2017 and No. 2018-074816 filed on Apr. 9, 2018. The entire disclosures of all of the above applications are incorporated herein by reference.

TECHNICAL FIELD

The present disclosure relates to a semiconductor device and a manufacturing method thereof.

BACKGROUND

Conventionally, there has been a SiC semiconductor device having a trench gate structure as a structure in which a channel density is increased so as to flow a large current. In an SiC semiconductor device having a trench gate structure, the breakdown electric field strength of SiC is high, and there may be a possibility that dielectric breakdown may occur when a high electric field is applied to the bottom of the trench. For this reason, for example, dielectric breakdown is prevented by forming an electric field relaxation layer with a single-layer structure below the base layer between the opposing trench gates to relax the electric field.

SUMMARY

According to example embodiments, a semiconductor device includes an inversion type semiconductor element, which has: a substrate; a drift layer; a saturation current suppression layer; a current dispersion layer; a base region; a source region; a connection layer; a plurality of trench gate structures; an interlayer insulation film; a source electrode; and a drain electrode. A channel region is provided in a portion of the base region in contact with each trench gate structure by applying a gate voltage to the gate electrode and applying a normal operation voltage as a drain voltage to the drain electrode; and a current flows between the source electrode and the drain electrode through the source region and the JFET portion.

DETAILED DESCRIPTION

Figure 1:
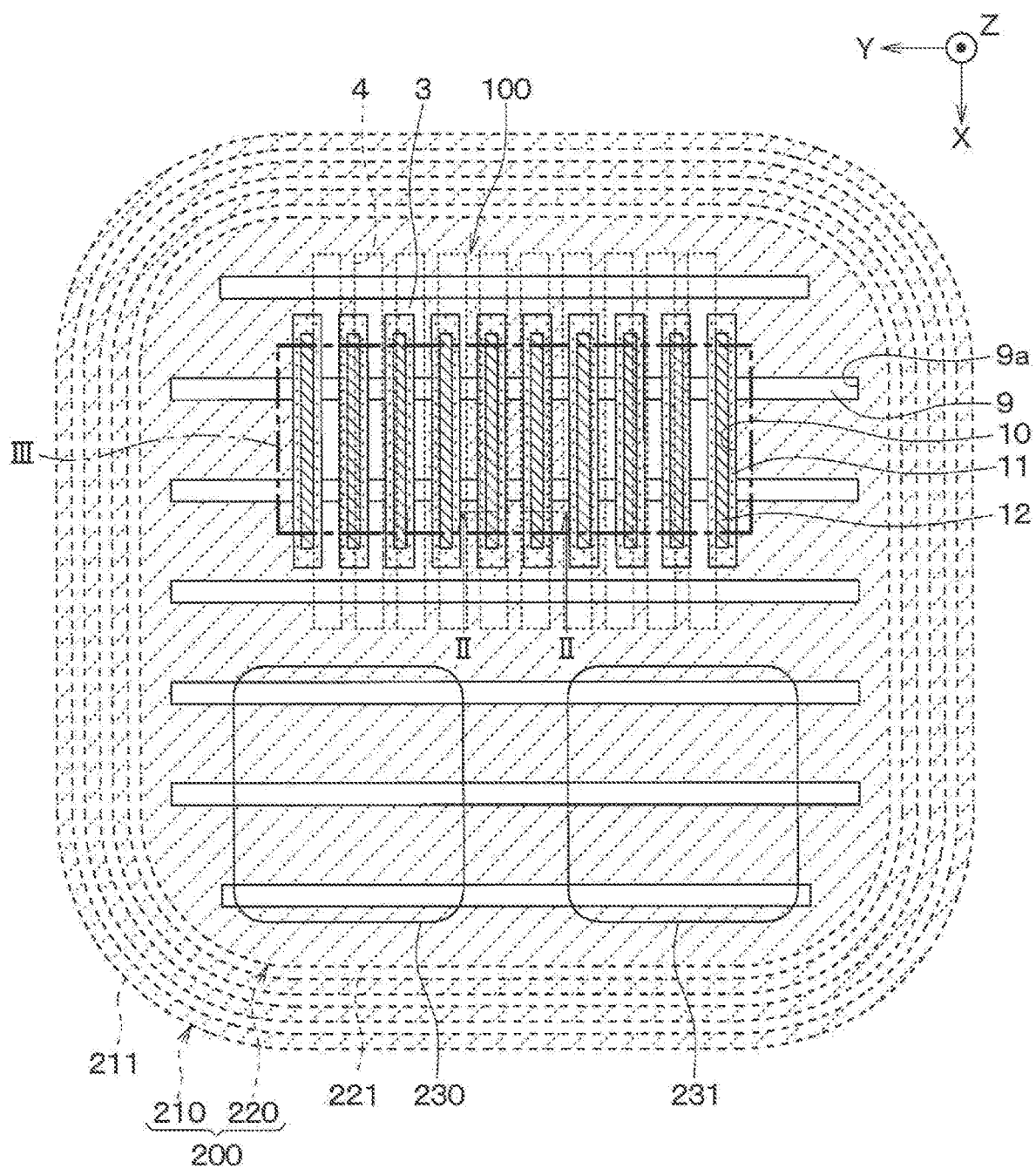
FIG. 1 is a top layout diagram showing a SiC semiconductor device according to a first embodiment.

Following embodiments relate to a semiconductor device and a manufacturing method thereof, and is particularly suitable when applied to a semiconductor element using a wide band gap semiconductor such as silicon carbide (hereinafter referred to as SiC) and a manufacturing method thereof.

When a structure includes an electric field relaxation layer between the trench gates, it is necessary to set the distance between the trench gates in consideration of the arrangement of the electric field relaxation layer between the trench gates. Thus, it may be difficult to narrow the distance between the trench gates. For this reason, the density of the trench gates may not be increased, and the channel resistance may not be sufficiently reduced.

The following embodiments provide a semiconductor device with reducing a channel resistance by increasing the density of trench gates and a manufacturing method thereof.

A semiconductor device includes: a substrate having a first or second conductivity type and made of semiconductor; a drift layer arranged on the substrate and made of semiconductor having the first conductivity type with an impurity concentration lower than the substrate; an electric field block layer arranged on the drift layer in a stripe pattern with a plurality of portions along one direction as a longitudinal direction and made of semiconductor having the second conductivity type; a saturation current suppression layer including a JFET portion made of semiconductor with the first conductivity type and having a plurality of portions in a stripe pattern alternately arranged with the electric field block layer along the one direction as the longitudinal direction; a current distribution layer made of semiconductor having the first conductivity type with a first conductivity type impurity concentration higher than the drift layer and arranged on the saturation current suppression layer; a base region made of semiconductor having the second conductivity type and arranged on the current distribution layer; and a source region made of semiconductor having the first conductivity type with the first conductivity type impurity concentration higher than the drift layer and arranged on the base region; and a block layer with the second conductivity type connecting the base region and the electric field block layer and extending in a direction crossing the one direction.

Furthermore, the semiconductor device further includes: a semiconductor element comprising: a trench gate structure in a stripe pattern with a plurality of portions along a same direction as the one direction as the longitudinal direction configured to include a gate insulation film covering an inner wall of a gate trench and a gate electrode arranged on the gate insulation film, which are disposed in the gate trench arranged from a surface of the source region to be deeper than the base region; an interlayer insulation film covering the gate electrode and the gate insulation film and having a contact hole; a source electrode electrically connected to the source region through the contact hole; and a drain electrode arranged on a back side of the substrate.

In this way, the longitudinal direction of the trench gate structure is the same as the longitudinal direction of the portions in the stripe pattern of the JFET portion and the electric field block layer, and the longitudinal direction of the connection layer intersects these longitudinal directions. With such a configuration, the interval between the trench gate structures can be set regardless of the connection layer, and the connection layer can be made narrower than in the case where the connection layer is arranged between the trench gate structures. Therefore, it is possible to increase the density of the trench gates, that is, to increase the channel density, thereby reducing the channel resistance.

Here, a parenthesized reference symbol attached to each constituent element or the like shows an example of the correspondence of the constituent element or the like and a specific constituent element or the like described in an embodiment to be described later.

Hereinafter, embodiments of the present disclosure will be described with reference to the drawings. In the following embodiments, the same or equivalent parts are denoted by the same reference numerals as each other, and explanations will be provided to the same reference numerals.

First Embodiment

A first embodiment will be described. Here, an SiC semiconductor device in which an inverted vertical MOSFET having a trench gate structure is formed as a semiconductor element will be described as an example.

Figure 2:
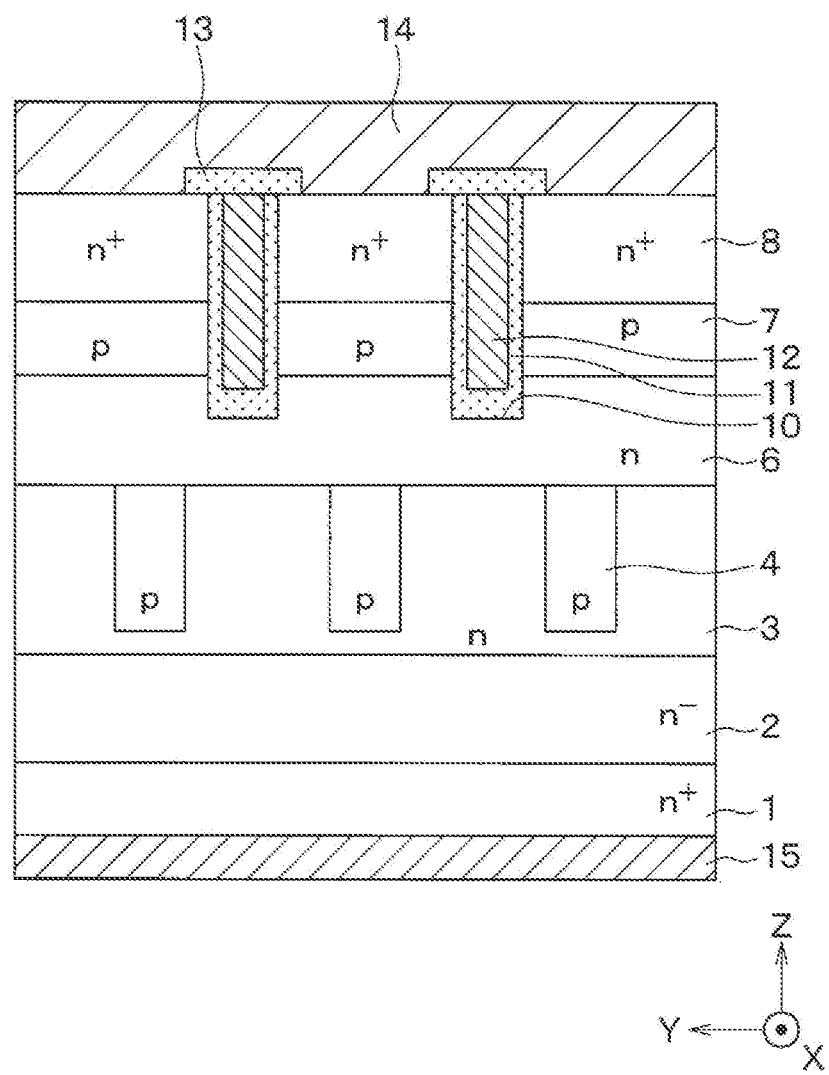
FIG. 2 is a diagram showing a cross-sectional view taken along line II-II of FIG. 1.
Figure 3:
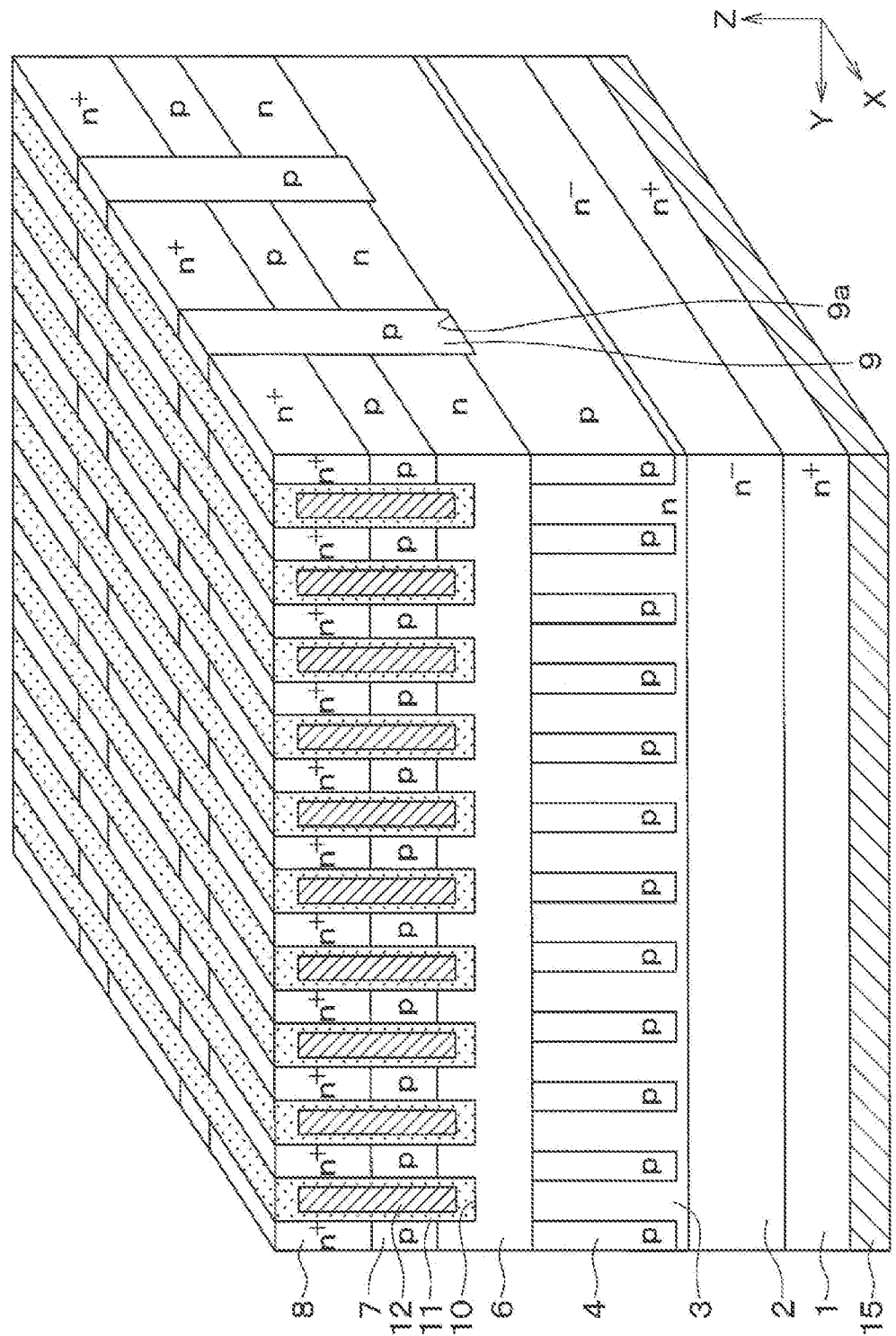
FIG. 3 is a perspective cross-sectional view of region III in FIG. 1.

The SiC semiconductor device shown in FIGS. 1 to 3 has a cell portion 100 in which a MOSFET having a trench gate structure is formed, and an outer peripheral portion 200 surrounding the cell portion 100. The outer peripheral portion has a guard ring portion 210 and a connection portion 220 disposed inside the guard ring portion, that is, between the cell portion and the guard ring portion 210. Although FIG. 1 is not a cross-sectional view, hatching is partially illustrated in order to make the drawing easily understandable.

In the cell portion 100, a vertical MOSFET shown in FIGS. 2 and 3 is formed as a semiconductor element. FIG. 3 is a perspective cross-sectional view of region III in FIG. 1, but a part of the configuration of the SiC semiconductor device is omitted in order to make the layout of each part easily understandable. In the following description, as shown in FIG. 3, a length direction of the vertical MOSFET is defined as an X direction, a width direction of the vertical MOSFET crossing the X direction is defined as a Y direction, and a thickness direction or a depth direction of the vertical MOSFET that is the normal direction with respect to the XY plane is defined as the Z direction.

As shown in FIGS. 2 and 3, in the SiC semiconductor device, an n$^+$ type substrate 1 made of SiC is used as a semiconductor substrate. An n$^-$ type drift layer 2 made of SiC is formed on a main surface of the n$^+$ type substrate 1. A surface of the n$^+$ type substrate 1 is a (0001) Si surface, for example, an n type impurity concentration is $5.9 \times 10^{18}$/cm$^3$, and a thickness is 100 μm. The n$^-$-type drift layer 2 has, for example, an n type impurity concentration of $7.0 \times 10^{15}$/cm$^3$ to $1.0 \times 10^{16}$/cm$^3$, and a thickness of 8.0 μm.

A JFET portion 3 made of SiC and an electric field block layer 4 are formed on the n$^-$ type drift layer 2, and the n$^-$ type drift layer 2 is connected to the JFET portion 3 at a position spaced away from the n$^+$ type substrate 1.

The JFET portion 3 and the electric field block layer 4 configure a saturation current suppression layer, and both of the JFET portion 3 and the electric field block layer 4 extend in the X direction and are alternately arranged in the Y direction. That is, when viewed from the normal direction with respect to the main surface of the n$^+$ type substrate 1, at least a portion of the JFET portion 3 and the electric field block layer 4 are each formed into multiple strip lines, that is, in a stripe shape, and are alternately arranged each other.

In the present embodiment, the JFET portion 3 is formed below the electric field block layer 4. For this reason, the striped portions of the JFET portion 3 are connected to each other below the electric field block layer 4, but each of the striped portions is interposed between the plurality of electric field block layers 4.

Each stripe shaped portion of the JFET portion 3, that is, each strip line, has a width of, for example, 0.2 to 0.6 μm and a pitch corresponding to a formation interval of, for example, 0.6 to 2.0 μm. The thickness of the JFET portion 3 is 1.5 μm, for example, and the n type impurity concentration is higher than that of the n$^-$ type drift layer 2, and is, for example, $5.0 \times 10^{17}$/cm$^3$ to $2.0 \times 10^{18}$/cm$^3$.

The electric field block layer 4 is formed of a p type impurity layer. As described above, the electric field block layer 4 has a stripe shape, and each strip-like portion of the stripe shaped electric field block layer 4 has a width of, for example, 0.15 to 1.4 µm and a thickness of, for example, 1.4 µm. The electric field block layer 4 has a p type impurity concentration of, for example, $3.0 \times 10^{17}/cm^3$ to $1.0 \times 10^{18}/cm^3$. In the present embodiment, the electric field block layer 4 has a constant p type impurity concentration in the depth direction. In the electric field block layer 4, a surface opposite to the n⁻ type drift layer 2 is disposed on the same plane as the surface of the JFET portion 3.

Further, an n type current dispersion layer 6 made of SiC is formed on the JFET portion 3 and the electric field block layer 4. The n type current dispersion layer 5 corresponds to a layer for diffusing a current flowing through a channel in the Y direction, as described later. For example, the n type impurity concentration of the n type current dispersion layer 6 is higher than that of the n⁻ type drift layer 2. In the present embodiment, the n type current dispersion layer 6 has an n type impurity concentration equal to or higher than that of the JFET portion 3 and a thickness of 0.5 µm.

A p type base region 7 made of SiC is formed on the n type current dispersion layer 6. An n⁺ type source region 8 made of SiC is formed on the p type base region 7. The n⁺ type source region 8 is formed on a portion of the p type base region 7 corresponding to the n type current dispersion layer 6.

The thickness of the p type base region 7 is lower than that of the electric field block layer 4 and the p type impurity concentration of the p type base region 7 is lower than that of the electric field block layer 4. For example, the p type impurity concentration is $3 \times 10^{17}/cm^3$ and the thickness is 0.3 µm. In addition, the n⁺ type source region 8 has an n type impurity concentration higher than that of the n type current dispersion layer 6 and has a thickness of 0.5 µm, for example.

A plurality of p type connection layers 9 are formed so as to penetrate the p type base region 7 and the n type current dispersion layer 6 from the surface of the n⁺ type source region 8 to reach the electric field block layer 4. In the present embodiment, the p type connection layer 9 is formed in a strip-line shape in a direction intersecting with the longitudinal direction of the stripe-shaped portions of the JFET portion 3 and the longitudinal direction of the electric field block layer 4, in this example, with the Y direction as a longitudinal direction, and is laid out in a stripe shape by arranging multiple p type deep layers 9 in the X direction. The p type base region 7 and the electric field block layer 4 are electrically connected to each other via the p type connection layer 9. In the case of this embodiment, a deep trench 9a that reaches the electric field block layer 4 from the surface of the n⁺ type source region 8 and penetrates the p type base region 7 and the n type current dispersion layer 6 is formed, and the p type connection layer 9 is formed by embedding in the deep trench 9a. The formation pitch of the p type connection layer 9 is set independently regardless of the cell pitch that is the formation interval of the trench gate structure described later, but is set to suppress an influence that the channel density is reduced in the portion where the p type connection layer 9 is formed. In the present embodiment, the distance between the p type connection layers 9 is, for example, 30 to 100 µm, and the width of each p type connection layer 9 is, for example, 0.4 to 1.0 µm. The width of each p type connection layer 9 may be set arbitrarily. Alternatively, in consideration of suppression of a decrease in channel density, it is preferable that the width may be ⅟₃₀ or less of the distance between the p type connection layers 9. Further, the depth of each p type connection layer 9 is set to 1.4 µm, for example.

Further, for example, the gate trench 10 is formed to have the width of 0.4 µm and the depth deeper by 0.2 to 0.4 µm than the total film thickness of the p type base region 7 and the n⁺ type source region 8, so as to penetrate the n⁺ type source region 8 and the p type base region 7 and to reach the n type current dispersion layer 6. The above described p type base region 7 and n⁺ type source region 8 are arranged so as to be in contact with the side surface of the gate trench 10. The gate trench 10 has a striped shape layout with the Y direction in FIG. 2 defined as the width direction, the direction that is the same as the longitudinal direction of the JFET portion 3 or the electric field block layer 4 and is defined as the X direction as the longitudinal direction, and the Z direction defined as the depth direction. As shown in FIGS. 1 to 3, the gate trench 10 is formed in a stripe shape in which a plurality of gate trenches 10 are arranged at equal intervals in the Y direction, and the p type base region 7 and the n⁺ type source 8 are interposed therebetween.

For example, as will be described later, the cell pitch that is the formation interval of the trench gate structure formed in the gate trench 10, that is, the cell pitch that corresponds to the arrangement interval of the adjacent gate trenches 10 is, for example, 0.6 to 2.0 µm. The width of the gate trench 10 may be arbitrary, but is smaller than the cell pitch. Further, the JFET pitch, which is the arrangement interval of the JFET portions 3, that is the arrangement interval of the electric field block layers 4 may be set independently regardless of the cell pitch. In the case of the present embodiment, the cell pitch and the JFET pitch are made different as shown in FIGS. 1 and 3. Alternatively, they may be made equal to each other.

A portion of the p type base region 7 located on the side surface of the gate trench 10 provides a channel region connecting the n⁺ type source region 8 and the n type current dispersion layer 6 when the vertical MOSFET is operated. The inner wall of the trench 10 including the channel region is covered with the gate insulation film 11. A gate electrode 12 made of doped Poly-Si is formed on the surface of the gate insulation film 11. The gate trench 10 is completely filled with the gate insulation film 11 and the gate electrode 12, and thereby the trench gate structure is formed.

As shown in FIG. 2, a source electrode 14 and the like are formed on the surface of the n⁺ type source region 8 and the surface of the gate electrode 12 via an interlayer insulation film 13. The source electrode 14 and the like are made of multiple metals, for example, Ni/Al and the like. N type SiC among a plurality of metals, specifically, at least a portion in contact with the n⁺ type source region 8 and the gate electrode 12 in case of n type impurity doping, is made of a metal capable of ohmic contact with the n type SiC. In addition, at least, a portion in contact with p type SiC among the multiple metals, specifically, in contact with the p type connection layer 9, is made of a metal capable of ohmic contact with the p type SiC. The source electrode 14 is formed on the interlayer insulation film 13 and is electrically insulated from the SiC portion. However, the source electrode 14 is electrically connected to the n⁺ type source region 8 and the p type connection layer 9 through a contact hole formed in the interlayer insulation film 13.

By contrast, a drain electrode 15 electrically connected to the n⁺ type substrate 1 is formed on a back surface of the n⁺ type substrate 1. The structure described above configures an inverted vertical MOSFET that has an n channel type and the trench gate structure. A cell region 100 is configured by arranging multiple cells of the vertical MOSFET described above.

Further, the guard ring portion 210 is provided so as to surround the cell portion 100 in which such a vertical MOSFET is formed, thereby forming an outer peripheral breakdown voltage structure. The guard ring portion 210 is constituted by a plurality of annular p type guard rings 211, and in the guard ring portion 210, by ion-implanting p type impurities into n type SiC constituting the JFET portion 3, etc. so that the guard ring portion 210 is formed simultaneously with the electric field block layer 4.

The connection portion 220 is a region from the cell portion 100 to the guard ring portion 210, and the connection portion 220 is provided with a p type layer 221. The p type layer 221 is formed simultaneously with the electric field block layer 4 and the p type guard ring 211 by, for example, ion-implanting p type impurities into the n type SiC constituting the JFET portion 3 in the connection portion 220. In the present embodiment, the p type layer 221 has a structure connected to the top end of each electric field block layer 4 and is fixed to the source potential.

Although not shown, in the guard ring portion 210, a recess that penetrates the $n^+$ type source region 8, the p type base region 7, and the n type current dispersion layer 6 is formed. For this reason, the mesa structure is configured such that the cell portion 100 and the connection portion 220 in which the concavity is not formed protrudes from the guard ring portion 210. As shown in FIG. 1, the connection portion 220 includes a gate pad 230 and a source pad 231. Although not shown, the gate pad 230 and the source pad 231 are formed on the interlayer insulation film 13. The gate pad 230 is connected to the gate electrode 12 through a contact hole formed in the interlayer insulation film 13 or a wiring layer formed on the interlayer insulation film 13. The source pad 231 is connected to the source electrode 14. Through these gate pad 230 and source pad 231, the gate electrode 12 and the source electrode 14 can be controlled to be a desired electric potential.

The SiC semiconductor device having the vertical MOSFETs configured as described above is operated, for example, by applying a gate voltage Vg of 20 V to the gate electrode 12 in a state where a source voltage Vs is 0 V and a drain voltage Vd is 1 V to 1.5 V. That is, when the gate voltage Vg is applied to the vertical MOSFET, the channel region is formed at the portion of the p type base region 7 being in contact with the gate trench 10, and an electric current flows between the drain and the source.

At this time, the JFET portion 3 and the electric field block layer 4 function as a saturation current suppression layer, and it is possible to maintain a low saturation current while achieving a low on-state resistance by providing a saturation current suppression effect. Specifically, since the striped portions of the JFET portion 3 and the electric field block layer 4 are alternately and repeatedly formed, the following operation is performed.

First, when the drain voltage Vd is a voltage to be applied during normal operation such as 1 to 1.5 V, for example, a depletion layer extends from a side of the electric field block layer 4 to the JFET portion 3 and an extending width of the depletion layer is smaller than the width of the striped portion in the JFET portion 3. Therefore, even when the depletion layer extends into the JFET portion 3, it may be possible to secure a current path. Since the n type impurity concentration of the JFET portion 3 is higher than that of the $n^-$ type drift layer 2 and the current path can be configured with a low resistance, it may be possible to provide the low on-state resistance.

Further, when the drain voltage Vd becomes higher than the voltage during normal operation due to a load short circuit or the like, the depletion layer extending from the side of the electric field block layer 4 to the JFET portion 3 extends beyond the width of the striped portion of the JFET portion 3. Then, the JFET portion 3 is immediately pinched off before the n type current dispersion layer 6 is pinched off. Then, the relation between the drain voltage Vd and the width of the depletion layer is determined based on the width of the striped portion of the JFET portion 3 and the n type impurity concentration. For this reason, the width of the striped portion and the n type impurity concentration of the JFET portion 3 are set so that the JFET portion 3 is pinched off when the voltage becomes slightly higher than the drain voltage Vd during normal operation. As a result, the JFET portion 3 can be pinched off even with a low drain voltage Vd. In this way, when the drain voltage Vd becomes higher than the voltage in the normal operation, the JFET portion 3 is immediately pinched off. It may be possible to maintain the low saturation current, and further improve a tolerance of the SiC semiconductor device due to a load short circuit or the like.

In this way, the JFET portion 3 and the electric field block layer 4 function as a saturation current suppression layer, and exhibit a saturation current suppression effect, thereby providing a SiC semiconductor device that can achieve both low on-state resistance and low saturation current.

Further, since the p type connection layer 9 intersects with respect to the trench gate structure, the interval between the trench gate structures can be set regardless of the p type connection layer 9. Thus, the trench gate structure may be made narrower than in the case of arranging the p type connection layer 9 between the trench gate structures. Also, the distance between the striped portions of the JFET portion 3 may be set regardless of the p type connection layer 9. For this reason, it becomes possible to set a JFET pitch much smaller. In this way, the formation area of the striped portion of the JFET portion 3 through which the current flows can be increased, so that the current path density is increased. As a result, the JFET resistance can be reduced, and the on-state resistance of the vertical MOSFET can be reduced.

Further, by providing the electric field block layer 4 so as to sandwich the JFET portion 3, the stripe shaped portion of the JFET portion 3 and the electric field block layer 4 are alternately and repeatedly formed. Therefore, even when the drain voltage Vd becomes a high voltage, the extension of the depletion layer extending from the bottom to the $n^-$ type drift layer 2 is suppressed by the electric field block layer 4. Thereby, it may be possible to prevent the depletion layer from extending into the trench gate structure. Therefore, the electric field suppression effect that lowers the electric field applied to the gate insulation film 11 can be provided, and the gate insulation film 11 can be prevented from being broken. Therefore, it may be possible to obtain a highly reliable element with high breakdown voltage strength. Since the depletion layer can be prevented from extending to the trench gate structure in this way, it may be possible to set the n type impurity concentration of the $n^-$ type drift layer 2 or the JFET portion 3 to be relatively high. Thus, it may be possible to achieve a low on-state resistance.

Therefore, the SiC semiconductor device having a vertical MOSFET with low on-state resistance and high reliability can be provided.

On the other hand, the SiC semiconductor device according to the present embodiment is a normally-off type semiconductor element in which no current flows between the drain and the source because the channel region is not formed when the gate voltage Vg is not applied. However, the JFET portion 3 is a normally-on type device because it does not pinch off unless the drain voltage Vd becomes higher than the voltage during normal operation even when the gate voltage Vg is not applied.

Here, although an example of the thickness, depth, and impurity concentration of each component of the vertical MOSFET has been described, these are merely examples, and other thicknesses, depths impurity concentrations may be set as long as the above operation is performed.

For example, the width of the JFET portion 3, that is, the dimension in the arrangement direction in which a plurality of JFET portions 3 are arranged may be set so as to obtain a saturation current suppression effect. The width of the JFET portion 3 that can provide the saturation current suppression effect varies depending on the n type impurity concentration of the JFET portion 3 and the p type impurity concentration of the electric field block layer 4, but the saturation current suppression effect may be obtained within the width in the range of 0.2 to 0.5 µm, for example.

Further, the width of the electric field block layer 4, that is, the dimension in the arrangement direction in which a plurality of electric field block layers 4 are arranged may be set in consideration of the low on-state resistance and the electric field suppression effect. When the width of the electric field block layer 4 is increased, the formation ratio of the JFET portion 3 is relatively reduced, which causes an increase in the JFET resistance, so that it is preferable to reduce the width. Although, when the width is too small, the electric field suppression effect is reduced in a case where the depletion layer spreads from the side surface of the electric field block layer 4 at the off state. For this reason, the width of the electric field block layer 4 is set in consideration of the realization of a low on-state resistance by reducing the JFET resistance and the electric field suppression effect. For example, when the width is in a range between 0.3 and 0.8 µm, the low on-state resistance is obtained and also the electric field suppression effect is obtained.

Next, a method of manufacturing the SiC semiconductor device including the vertical MOSFET with the n channel type inverted trench gate structure according to the present embodiment will be described with reference to cross-sectional views of the SiC semiconductor device during a manufacturing process shown in FIGS. 4A to 4H.

Figure 4A:
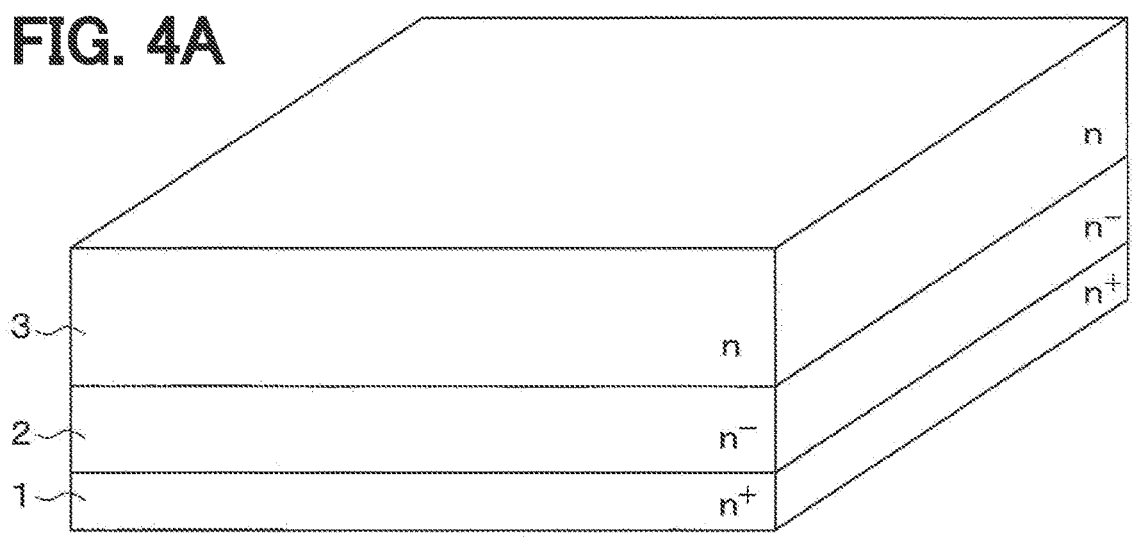
FIG. 4A is a perspective cross-sectional view illustrating a manufacturing process of the SiC semiconductor device shown in FIGS. 1 to 3.

[Process Shown in FIG. 4A]

First, the $n^+$ type substrate 1 is prepared as a semiconductor substrate. Then, an $n^-$ type drift layer 2 made of SiC is formed on the main surface of the $n^+$ type substrate 1 by epitaxial growth using a CVD (chemical vapor deposition) apparatus (not shown). Alternatively, a so-called epitaxial substrate in which the $n^-$ type drift layer 2 is preliminarily grown on the main surface of the $n^+$ type substrate 1 may be used. The JFET portion 3 made of SiC is epitaxially grown on the $n^-$ type drift layer 2.

The epitaxial growth is performed by introducing a gas serving as an n type dopant, for example, nitrogen gas in addition to silane or propane that is a raw material gas of SiC.

Figure 4B:
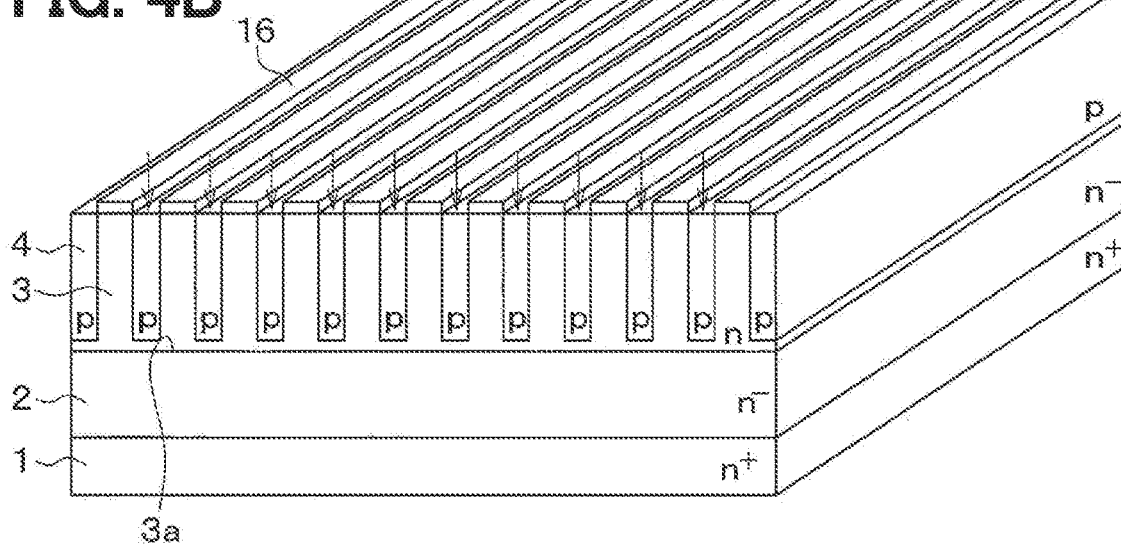
FIG. 4B is a perspective cross-sectional view illustrating a manufacturing process of the SiC semiconductor device continued from FIG. 4A.

[Process Shown in FIG. 4B]

After a mask 16 is arranged on the surface of the JFET portion 3, the mask 16 is patterned to open a region where the electric field block layer 4 is to be formed. The electric field block layer 4 is formed by ion implantation of p type impurities. Thereafter, the mask 16 is removed.

Here, the electric field block layer 4 is formed by the ion implantation. Alternatively, the electric field block layer 4 may be formed by a method other than the ion implantation. For example, the JFET portion 3 is selectively and anisotropically etched to form a recess portion at a position corresponding to the electric field block layer 4, a p type impurity layer is epitaxially grown on the recess portion, and then the p type impurity layer is flattened at a portion located over the JFET portion 3 to form the electric field block layer 4. In this manner, the electric field block layer 4 can also be formed by epitaxial growth. When the p type SiC is epitaxially grown, a gas to be a p type dopant, for example, trimethylaluminum (hereinafter referred to as TMA) may be introduced in addition to the raw material gas of SiC.

Figure 4C:
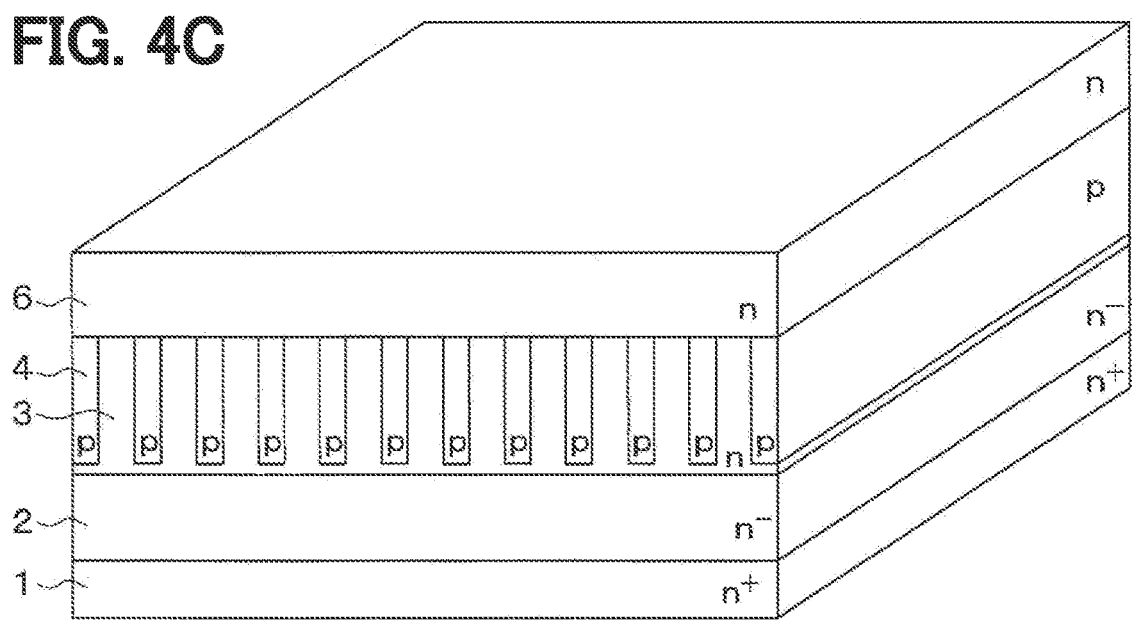
FIG. 4C is a perspective cross-sectional view illustrating a manufacturing process of the SiC semiconductor device continued from FIG. 4B.

[Process Shown in FIG. 4C]

Subsequently, the n type SiC is epitaxially grown on the JFET portion 3 and the electric field block layer 4 to form the n type current dispersion layer 6.

Figure 4D:
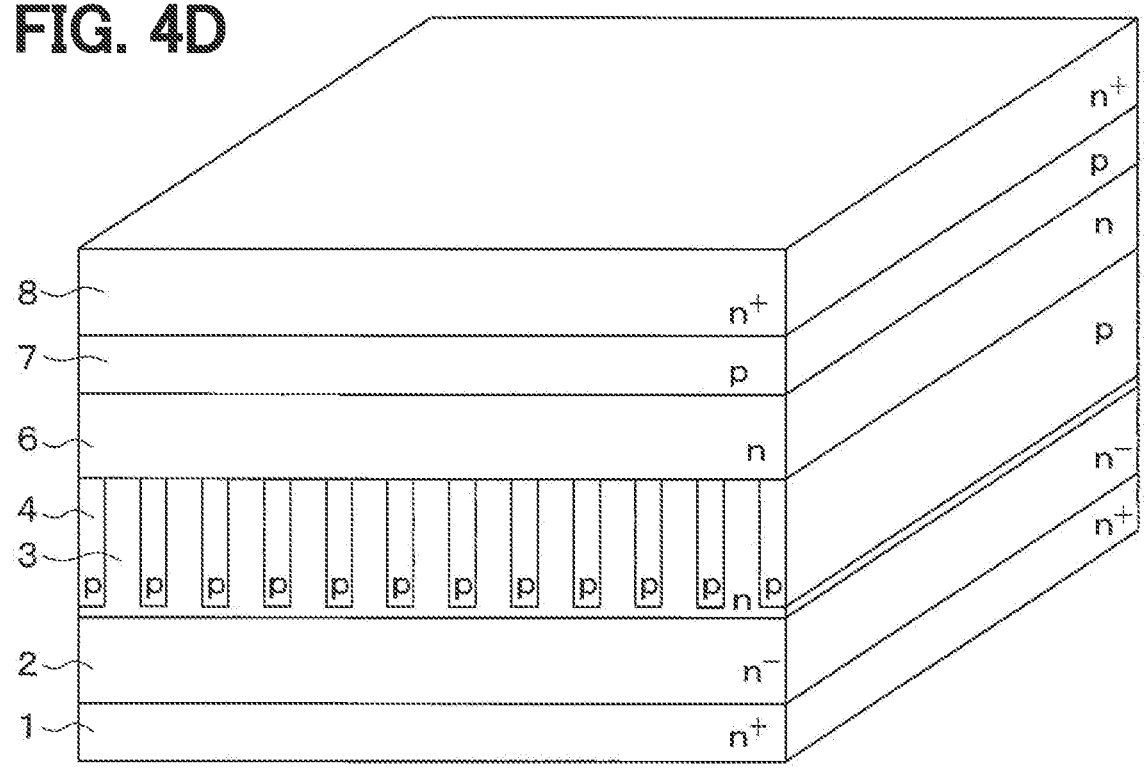
FIG. 4D is a perspective cross-sectional view illustrating a manufacturing process of the SiC semiconductor device continued from FIG. 4C.

[Process Shown in FIG. 4D]

A p type base region 7 and an $n^+$ type source region 8 are epitaxially grown on the n type current dispersion layer 6 using a CVD apparatus (not shown).

Figure 4E:
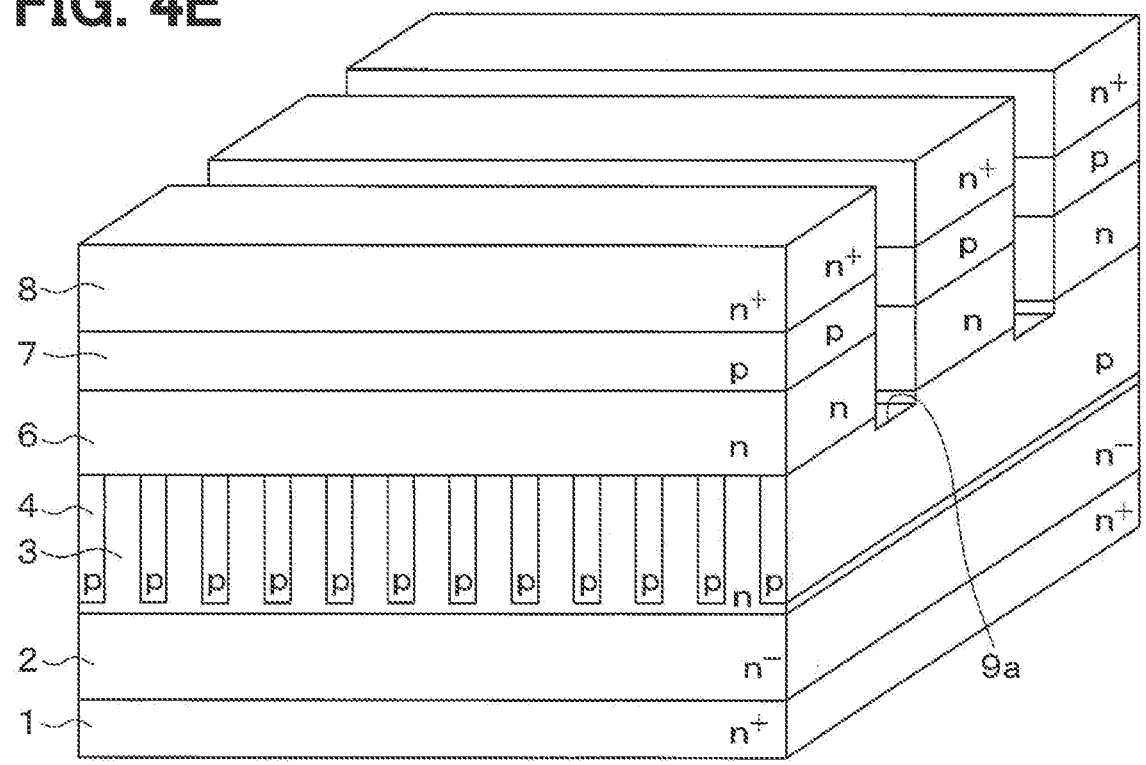
FIG. 4E is a perspective cross-sectional view illustrating a manufacturing process of the SiC semiconductor device continued from FIG. 4D.

[Process Shown in FIG. 4E]

A mask (not shown) having an opening at a position corresponding to the p type connection layer 9 is formed on the $n^+$ type source region 8. Then, by performing anisotropic etching such as RIE (Reactive Ion Etching) using the mask, the $n^+$ type source region 8, the p type base region 7 and the n type current dispersion layer 6 are sequentially removed, so that a deep trench 9a is formed to reach the JFET portion 3 and the electric field block layer 4. Then, the mask is removed.

Figure 4F:
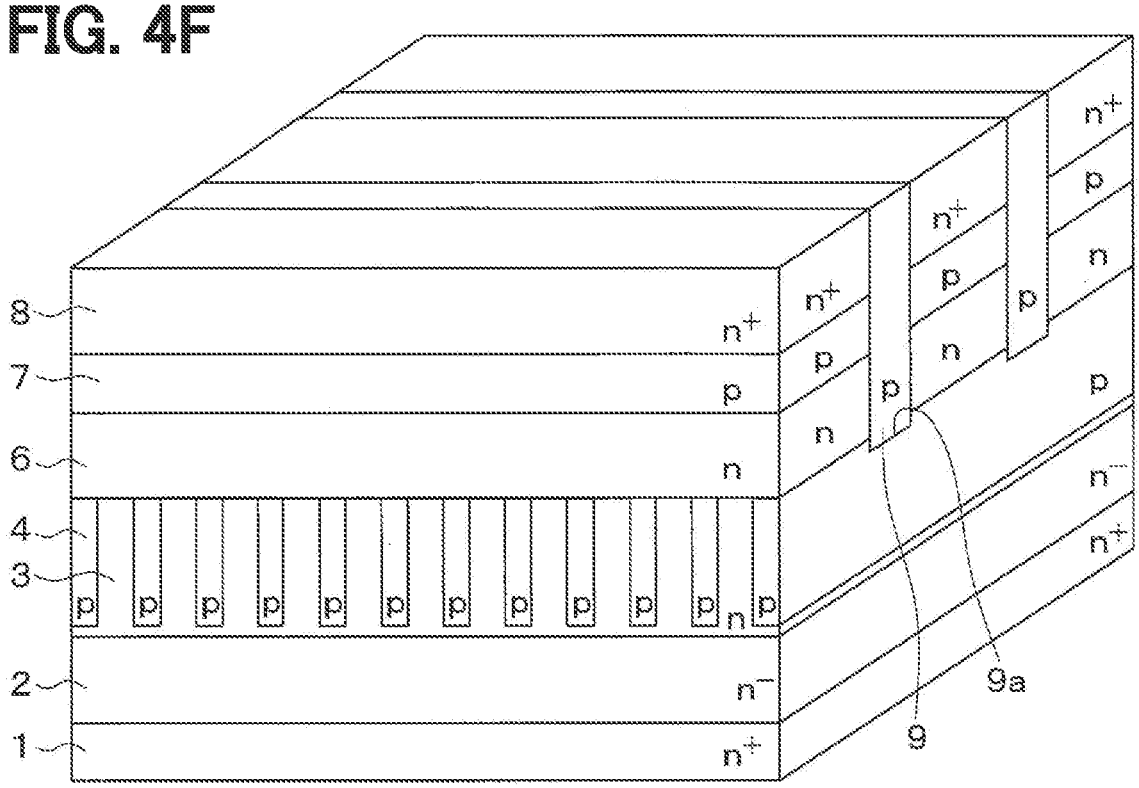
FIG. 4F is a perspective cross-sectional view illustrating a manufacturing process of the SiC semiconductor device continued from FIG. 4E.

[Process Shown in FIG. 4F]

Using a CVD apparatus (not shown), p type SiC is epitaxially grown so as to fill the deep trench 9a. Then, the p type connection layer 9 is formed by remaining the p type SiC only in the deep trench 9a by an etch back process.

Figure 4G:
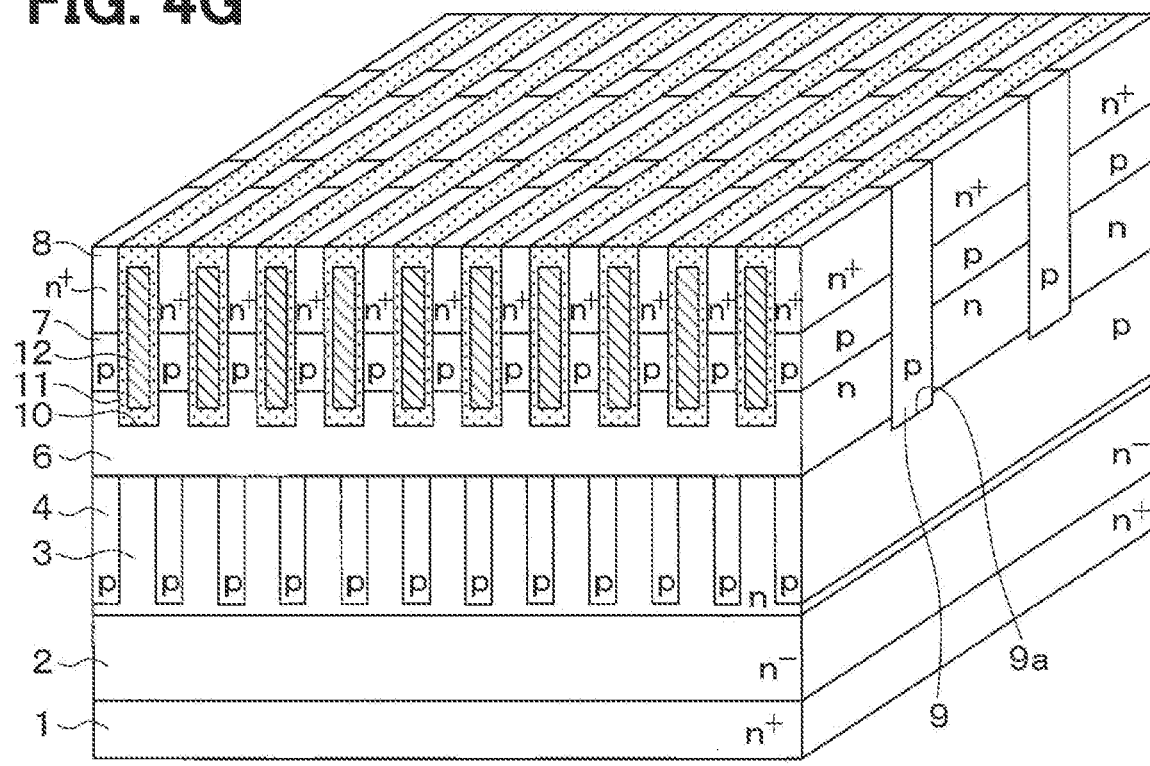
FIG. 4G is a perspective cross-sectional view illustrating a manufacturing process of the SiC semiconductor device continued from FIG. 4F.

[Process Shown in FIG. 4G]

A mask not shown is formed on the $n^+$ type source region 4 and the like, and then a region of the mask where the gate trench 10 is to be formed is opened. Then, the gate trench 10 is formed by performing anisotropic etching process such as RIE using a mask.

After the mask is removed, for example, the gate insulation film 11 is formed by performing thermal oxidation, so that the gate insulation film 11 covers the inner wall surface of the gate trench 10 and the surface of the $n^+$ type source region 8. After Poly-Si doped with p type impurities or n type impurities is deposited, the Poly-Si is etched back. At least the Poly-Si is remained in the gate trench 10, and thereby the gate electrode 12 is formed. Thereby, the trench gate structure is completed.

The subsequent steps are not shown. However, the following steps are performed. The interlayer insulation film 13 made of, for example, an oxide film or the like is formed to cover the surfaces of the gate electrode 12 and the gate insulation film 11. Further, a contact hole for exposing the $n^+$ type source region 8 and the p type connection layer 9 is formed in the interlayer insulation film 13 using a mask (not shown). After the electrode material comprised by, for example, the stacked structure made of multiple metals is formed on the surface of the interlayer insulation film 13, the source electrode 14 is formed by patterning the electrode material. Further, the drain electrode 15 is formed on the back surface side of the n+ type substrate 1. In this way, the SiC semiconductor device according to the present embodiment is completed.

As described above, in the SiC semiconductor device of the present embodiment, the longitudinal direction of the trench gate structure and the longitudinal direction of the striped portion of the JFET portion 3 and the longitudinal direction of the electric field block layer 4 are set in the same direction. On the other hand, the longitudinal direction of the p type connection layer 9 intersects these directions. With such a configuration, the interval between the trench gate structures can be determined regardless of the p type connection layer 9, and the p type connection layer 9 can be made narrower than in the case where the connection layer 9 is arranged between the trench gate structures. Therefore, it is possible to increase the density of the trench gates, that is, to increase the channel density, thereby reducing the channel resistance.

Further, the interval between the JFET portions 3 can also be determined regardless of the p type connection layer 9. For this reason, it becomes possible to set a JFET pitch much smaller. In this way, the formation area of the JFET portion 3 through which current flows can be increased, so that the current path density is increased. As a result, the JFET resistance can be reduced, and the on-state resistance of the vertical MOSFET can be reduced.

Second Embodiment

A second embodiment will be described. In the present embodiment, the structure of the JFET portion 3 and the electric field block layer 4 is changed with respect to the first embodiment, and the others are the same as those in the first embodiment. Only the different parts will be described.

Figure 5:
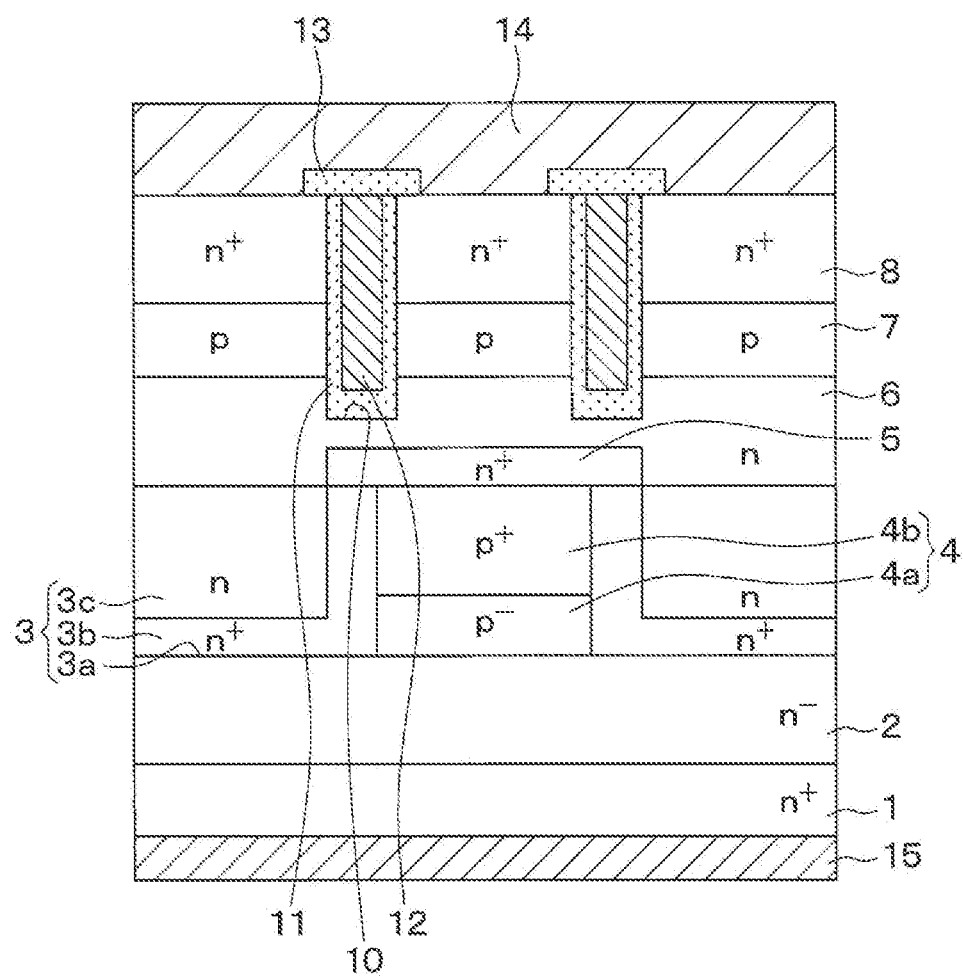
FIG. 5 is a cross-sectional view illustrating a portion of an SiC semiconductor device according to a second embodiment.
Figure 6:
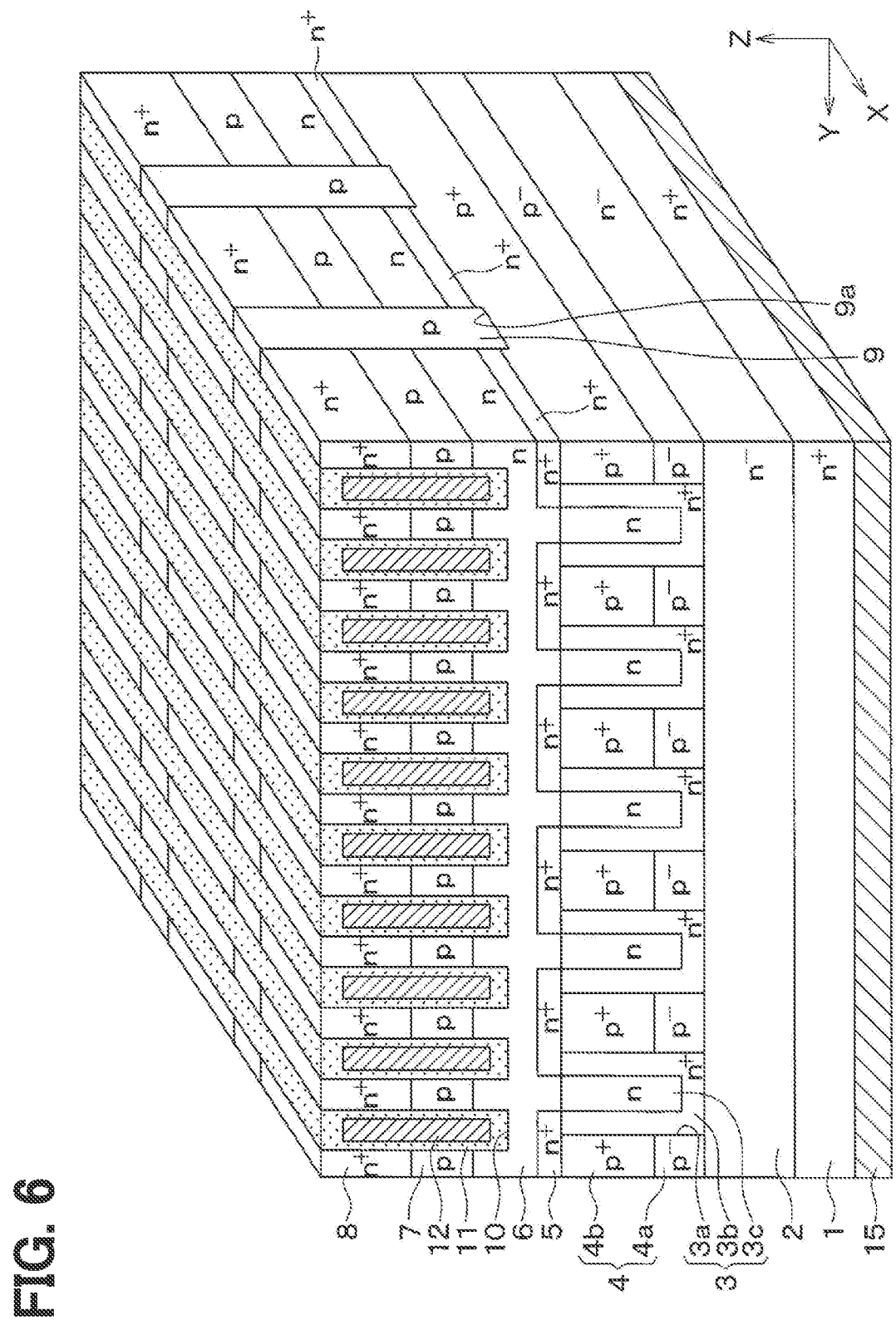
FIG. 6 is a perspective cross-sectional view illustrating a portion of an SiC semiconductor device according to the second embodiment.

As shown in FIGS. 5 and 6, in the present embodiment, the JFET portion 3 and the electric field block layer 4 are made of a plurality of layers.

Specifically, the JFET portion 3 of this embodiment is configured such that an n+ type layer 3b and an n type layer 3c are provided in a trench 3a formed so as to penetrate the electric field block layer 4. The n+ type layer 3b has an n type impurity concentration higher than that of the n− type drift layer 2. The n type layer 3c has a lower n type impurity concentration than the n+ type layer 3b. The n+ type layer 3b and the n type layer 3c correspond to a first layer and a second layer, respectively. The n+ type layer 3b is formed so as to cover the bottom surface and the side surface of the trench 3a, and the n type layer 3c covers the surface of the n+ type layer 3b and embeds the remaining part other than the n+ type layer 3b in the trench 3a.

The trench 3a has, for example, a width, that is, a dimension in the Y direction of 0.25 μm and a depth of 1.5 μm. Although the formation interval of the trenches 3a, that is, the trench pitch, can be set independently irrespective of the formation interval of the trench gate structures, that is, the cell pitch, in this embodiment, one trench 3a is provided with respect to two trench gate structures. In the present embodiment, the depth of the trench 3a is the same as the thickness of the electric field block layer 4 so that the bottom surface of the JFET portion 3 and the bottom surface of the electric field block layer 4 are disposed on the same plane. Further, the bottom of the trench 3a is provided by the surface of the n− type drift layer 2. For example, in the n+ type layer 3b, an n type impurity concentration is $5.0\times10^{17}$ to $2.0\times10^{18}/cm^3$, and a thickness is 0.05 μm. For example, in the n type layer 3c, an n type impurity concentration is $5.0\times10^{15}$ to $2.0\times10^{16}/cm^3$, and a thickness is 0.15 μm.

Further, the electric field block layer 4 of the present embodiment includes a p− type layer 4a and a p+ type layer 4b having different p type impurities. The p− type layer 4a corresponds to the lower layer and is formed in contact with the n− type drift layer 2. The p+ type layer 4b corresponds to the upper layer, and is formed on the p− type layer 4a, that is, at a position spaced away from the n− type drift layer 2. The p− type layer 4a has, for example, a p type impurity concentration of $1.0\times10^{16}$ to $5.0\times10^{16}/cm^3$ and a thickness of 0.5 m. The p+ type layer 4b has, for example, a p type impurity concentration of $3.0\times10^{17}$ to $1.0\times10^{18}/cm^3$ and a thickness of 1.0 μm. In the present embodiment, the p− type layer 4a and the p+ type layer 4b have a constant p type impurity concentration in the depth direction. Further, as described above, in the present embodiment, the depth of the trench 3a is the same as the thickness of the electric field block layer 4, so that the depth of the trench 3a is 1.5 μm, which corresponds to the total thickness of thickness of the p− type layer 4a and the p+ type layer 4b.

Further, an n+ type layer 5 is formed on the electric field block layer 4 and the JFET portion 3. The n+ type layer 5 is formed together with the n+ type layer 3b, is formed on the surface of the p+ type layer 4b, and connects the n+ type layer 3b formed on the adjacent side surface of the adjacent trench 3a. The n+ type layer 5 has the same n type impurity concentration and thickness as the n+ type layer 3b. Here, based on the plane orientation dependency of the crystal growth of SiC, the thickness of the n+ type layer 5 is the same as a portion of the n+ type layer 3b located at the bottom of the trench 3a, and in some cases, the thickness of the n+ type layer 5 may be different from a portion of the n+ type layer 3b located at the side wall of the trench 3a.

The n+ type layer 5 is not formed so as to fill the trench 3a. For this reason, at the time of epitaxial growth when forming the n type layer 3c, the n type layer 3c can be formed in the trench 3a through a portion where the n+ type layer 5 is not formed.

The portions other than the JFET portion 3, the electric field block layer 4 and the n+ type layer 5 are similar to those in the first embodiment.

The SiC semiconductor device having the vertical MOSFETs configured as described above is operated, for example, by applying a gate voltage Vg of 20 V to the gate electrode 12 in a state where a source voltage Vs is 0 V and a drain voltage Vd is 1 V to 1.5 V. That is, when the gate voltage Vg is applied to the vertical MOSFET, the channel region is formed at the portion of the p type base region 7 being in contact with the gate trench 10, and an electric current flows between the drain and the source.

Also in the structure of this embodiment, the JFET portion 3 and the electric field block layer 4 function as a saturation current suppression layer, and a structure is provided such that a low saturation current is maintained while achieving a low on-state resistance with exhibiting a saturation current suppression effect. Specifically, since the high-concentration n+ type layer 3b is disposed in the portion of the JFET portion 3 in contact with the electric field block layer 4 while the JFET portion 3 and the electric field block layer 4 are alternately and repeatedly formed, the n+ type layer 3b functions as a depletion layer adjustment layer, and the following operation is performed.

First, when the drain voltage Vd is a voltage applied during normal operation such as 1 to 1.5 V, for example, the depletion layer extending from the electric field block layer 4 side to the n+ type layer 3b extends only by a width smaller than the thickness of the n+ type layer 3b. That is, the n+ type layer 3b functions as a layer that stops the depletion layer from extending. For this reason, since it becomes possible to suppress the extension of the depletion layer into the JFET portion 3 and to suppress the current path from becoming narrow, it is possible to achieve a low on-state resistance.

Further, a portion of the n⁺ type layer 3b where the depletion layer does not extend functions as a current path. Since the n+ type layer 3b has a high n type impurity concentration and a low resistance, the n+ type layer 3b functions as a current path, thereby further reducing the on-state resistance.

Further, when the drain voltage Vd becomes higher than the voltage during normal operation due to a load short circuit or the like, the depletion layer extending from the electric field block layer 4 side to the n⁺ type layer 3b extends beyond the thickness of the n⁺ type layer 3b. Then, the JFET portion 3 is immediately pinched off before the n type current dispersion layer 6 is pinched off. At this time, the relationship between the drain voltage Vd and the width of the depletion layer is determined based on the thickness of the n⁺ type layer 3b and then type impurity concentration. For this reason, by setting the thickness of the n+ type layer 3b and the n type impurity concentration so that the JFET portion 3 is pinched off when the voltage becomes slightly higher than the drain voltage Vd during normal operation, the JFET portion 3 is pinched off even in a low drain voltage. In this way, when the drain voltage Vd becomes higher than the voltage in the normal operation, the JFET portion 3 is immediately pinched off. It may be possible to maintain the low saturation current, and further improve a tolerance of the SiC semiconductor device due to a load short circuit or the like.

In this way, the JFET portion 3 and the electric field block layer 4 function as a saturation current suppression layer, and exhibit a saturation current suppression effect, thereby providing a SiC semiconductor device that can achieve both low on-state resistance and low saturation current.

Furthermore, the electric field block layer 4 is not entirely configured by the p+ type layer 4b having a high p type impurity concentration, but further includes p⁻ type layer 4a having a low p type impurity concentration disposed at a portion in contact with the n⁻ type drift layer 2. When the electric field block layer 4 is entirely configured by only the p⁺ type layer 4b, the extension amount of the depletion layer extending from the electric field block layer 4 to the n⁻ type drift layer 2 side becomes large. Further, the depletion layer in the n⁻ type drift layer 2 extends not only below the electric field block layer 4 but also below the JFET portion 3 from the boundary position between the electric field block layer 4 and the JFET portion 3 so as to enter below the JFET portion 3. That is, the extension amount of the two-dimensional depletion layer that extends two-dimensionally in the n⁻ type drift layer 2 increases. For this reason, there is a concern that the current outlet in the JFET portion 3 may be narrowed and the on-state resistance may be increased.

On the other hand, as in this embodiment, when the portion of the electric field block layer 4 in contact with the n⁻ type drift layer 2 is configured by the p⁻ type layer 4a, an electric field absorption effect for reducing the amount of extension of the two-dimensional depletion layer into the n⁻ type drift layer 2 is obtained since the p type impurity concentration of the p⁻ type layer 4a is lowered. Thereby, the narrowing of the current outlet in the JFET portion 3 is suppressed, and a low on-resistance can be maintained.

On the other hand, the SiC semiconductor device according to the present embodiment is a normally-off type semiconductor element in which no current flows between the drain and the source because the channel region is not formed when the gate voltage Vg is not applied. However, the JFET portion 3 is a normally-on type device because it does not pinch off unless the drain voltage Vd becomes higher than the voltage during normal operation even when the gate voltage Vg is not applied.

Here, although an example of the thickness, depth, and impurity concentration of each component of the vertical MOSFET has been described, these are merely examples, and other thicknesses, depths impurity concentrations may be set as long as the above operation is performed.

Next, a method of manufacturing the SiC semiconductor device including the vertical MOSFET with the n channel type inverted trench gate structure according to the present embodiment will be described with reference to cross-sectional views of the SiC semiconductor device during a manufacturing process shown in FIGS. 7A to 7H.

Figure 7A:
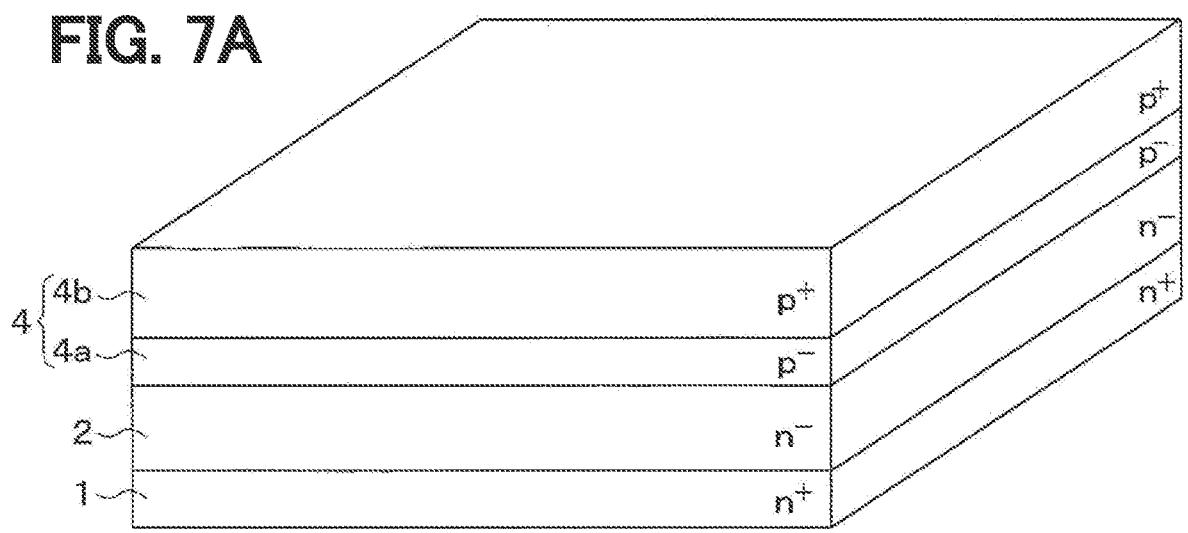
FIG. 7A is a perspective cross-sectional view illustrating a manufacturing process of the SiC semiconductor device shown in FIGS. 1 to 3.

[Process Shown in FIG. 7A]

First, the n⁺ type substrate 1 is prepared as a semiconductor substrate. Then, n⁻ type drift layer 2 made of SiC is formed on the main surface of n⁺ type substrate 1 by epitaxial growth using a CVD apparatus (not shown). Alternatively, a so-called epitaxial substrate in which the n⁻ type drift layer 2 is preliminarily grown on the main surface of the n⁺ type substrate 1 may be used. Then, an electric field block layer 4 made of SiC is formed on the n⁻ type drift layer 2. Specifically, after forming the p⁻ type layer 4a on the surface of the n⁻ type drift layer 2, the p⁺ type layer 4b is subsequently formed on the p⁻ type layer 4a.

Epitaxial growth is performed by introducing an n type dopant or a gas that provides a p type dopant in addition to the SiC raw material gas, but it may be difficult to epitaxially grow the p type SiC continuously subsequent to the n type SiC. For this reason, n type SiC and p type SiC may be epitaxially grown by separate CVD apparatuses. Further, since the p⁻ type layer 4a and the p+ type layer 4b have the same conductivity type, they can be easily and continuously formed only by changing the amount of TMA introduced, for example.

Figure 7B:
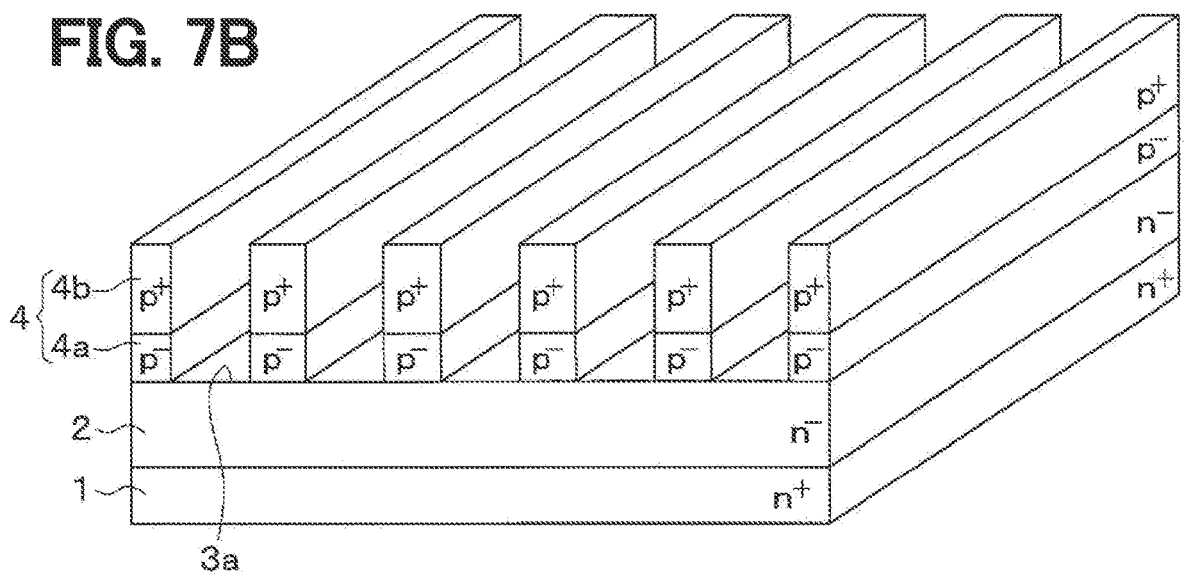
FIG. 7B is a perspective cross-sectional view illustrating a manufacturing process of the SiC semiconductor device continued from FIG. 7A.

[Process Shown in FIG. 7B]

A mask (not shown) having an opening at a position corresponding to the JFET portion 3 is formed on the electric field block layer 4. Then, the electric field block layer 4 is removed by performing anisotropic etching such as RIE using the mask to form the trench 3a, and the n⁻ type drift layer 2 is exposed at the bottom of the trench 3a. Thereafter, the mask used at the time of etching is removed.

Figure 7C:
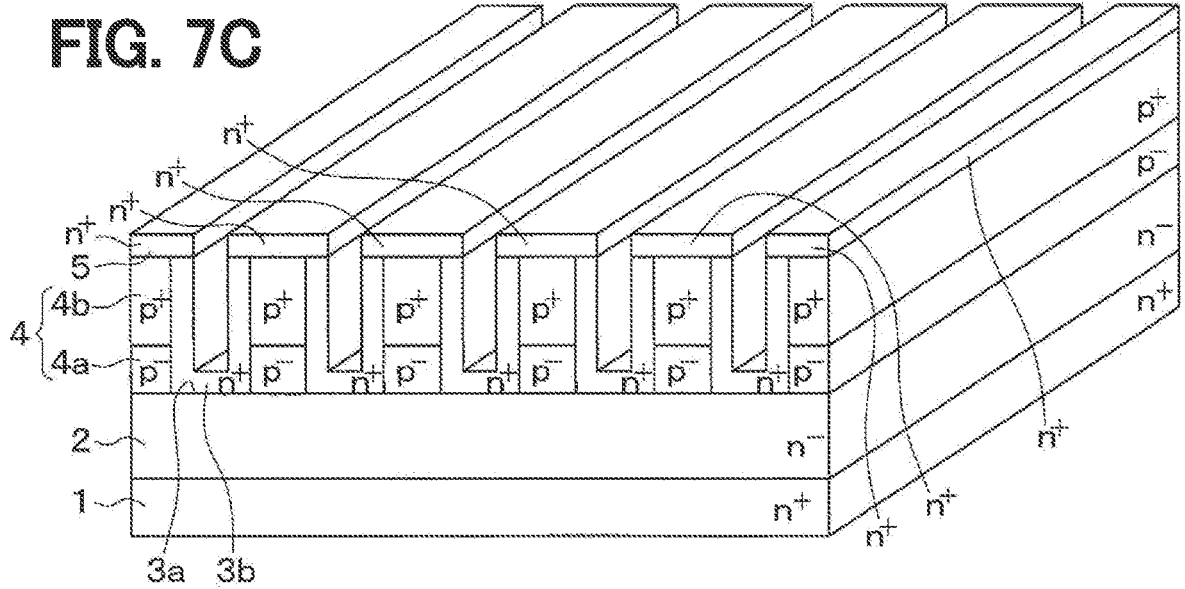
FIG. 7C is a perspective cross-sectional view illustrating a manufacturing process of the SiC semiconductor device continued from FIG. 7B.

[Process Shown in FIG. 7C]

The n⁺ type layer 3b is formed in the trench 3a and the n⁺ type layer 5 is formed on the surface of the electric field block layer 4 by epitaxial growth using a CVD apparatus (not shown) at the same time.

Figures 7D, 7E:
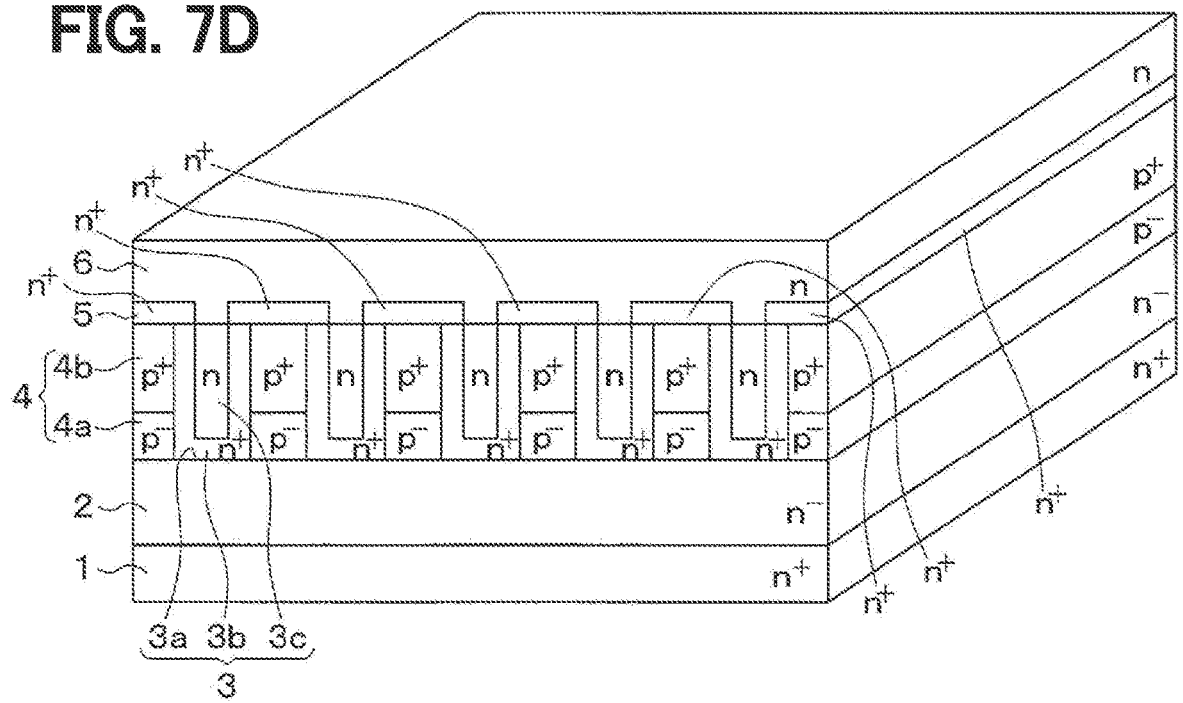
FIG. 7D is a perspective cross-sectional view illustrating a manufacturing process of the SiC semiconductor device continued from FIG. 7C.
FIG. 7E is a perspective cross-sectional view illustrating a manufacturing process of the SiC semiconductor device continued from FIG. 7D.
Figure 7F:
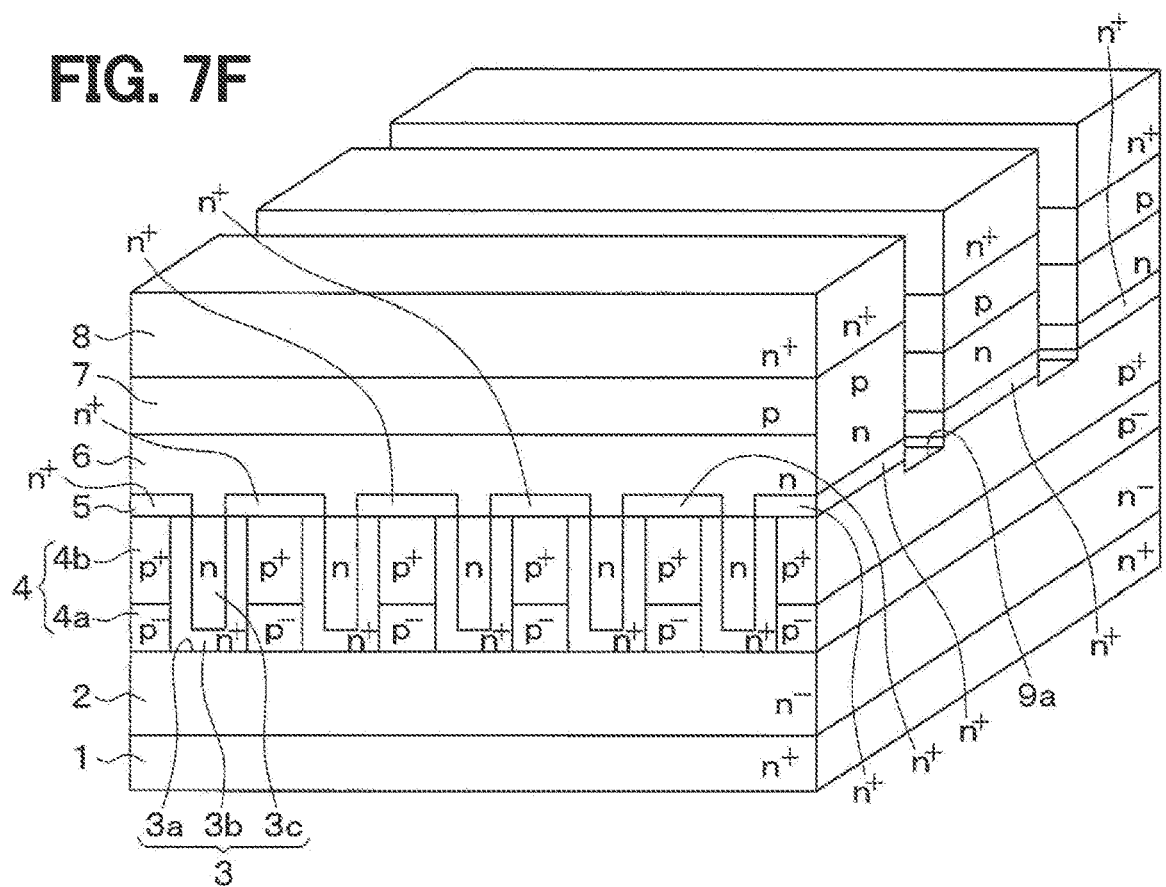
FIG. 7F is a perspective cross-sectional view illustrating a manufacturing process of the SiC semiconductor device continued from FIG. 7E.
Figure 7G:
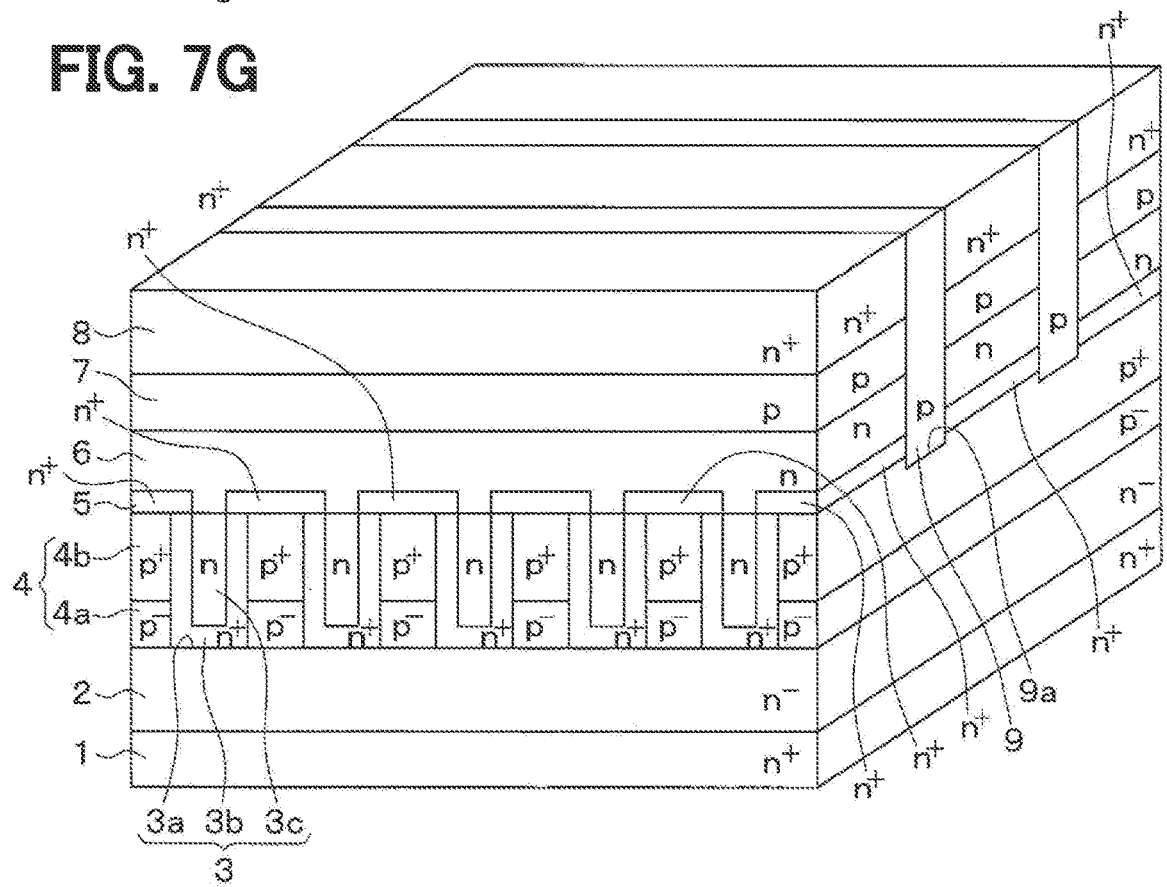
FIG. 7G is a perspective cross-sectional view illustrating a manufacturing process of the SiC semiconductor device continued from FIG. 7F.
Figure 7H:
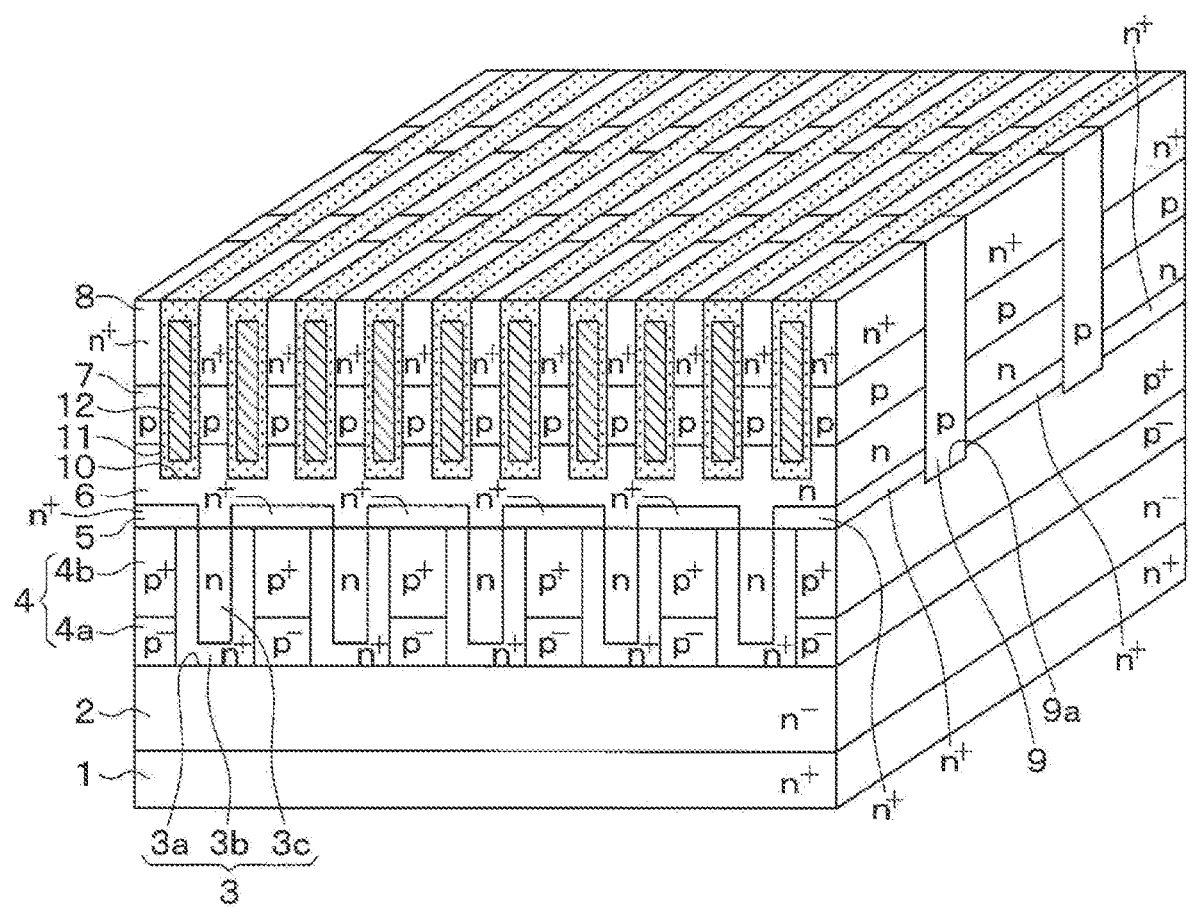
FIG. 7H is a perspective cross-sectional view illustrating a manufacturing process of the SiC semiconductor device continued from FIG. 7G.

[Process Shown in FIG. 7D]

Subsequently, n type SiC is epitaxially grown on the n+ type layer 3b and the n⁺ type layer 5, thereby forming the n type layer 3c and simultaneously forming the n type current dispersion layer 6. At this time, the n⁺ type layer 3b and the n⁺ type layer 5, the n type layer 3c and the n type current dispersion layer 6 have the same conductivity type. For this reason, in the CVD apparatus used for the epitaxial growth of the n⁺ type layer 3b and the n⁺ type layer 5, the n type layer 3c and the n type current dispersion layer 6 can be epitaxially grown continuously by changing the introduction amount of gas to be an n type dopant.

Thereafter, as the steps shown in FIGS. 7E to 7H, the same steps as the steps shown in FIGS. 4D to 4G described in the first embodiment are performed, and thereafter the forming steps for the interlayer insulation film 13, the source electrode 14, and the drain electrode 15 are performed.

The SiC semiconductor device according to the present embodiment can be manufactured by the manufacturing method described above. At this time, as described above, in addition to the p⁻ type layer 4a and the p⁺ type layer 4b, the n⁺ type layer 3b, the n⁺ type layer 5, the n type layer 3c, and the n type current dispersion layer 6 are formed after the formation of the n⁻ type drift layer 2 and before the formation of the p type base region 7. Although a plurality of layers are epitaxially grown in this way, the p⁺ type layer 4b after the formation of the p− type layer 4a has the same conductivity type, and the n+ type layer 3b and the n+ type layer 5 and the n type layer 3c and the n type current dispersion layer 6 are also formed to have the same conductivity type. For this reason, the same conductivity type can be easily and continuously formed in the same CVD apparatus. Therefore, the epitaxial growth for forming these multiple layers can be completed twice, the manufacturing process of the SiC semiconductor device can be simplified, and the manufacturing cost can be reduced.

Third Embodiment

A third embodiment will be described. In the present embodiment, the n⁺ type layer 5 is eliminated from the second embodiment, the configuration of the p type connection layer 9 is changed, and the others are similar to those in the second embodiment. Only parts different from the second embodiment will be described.

Figure 8:
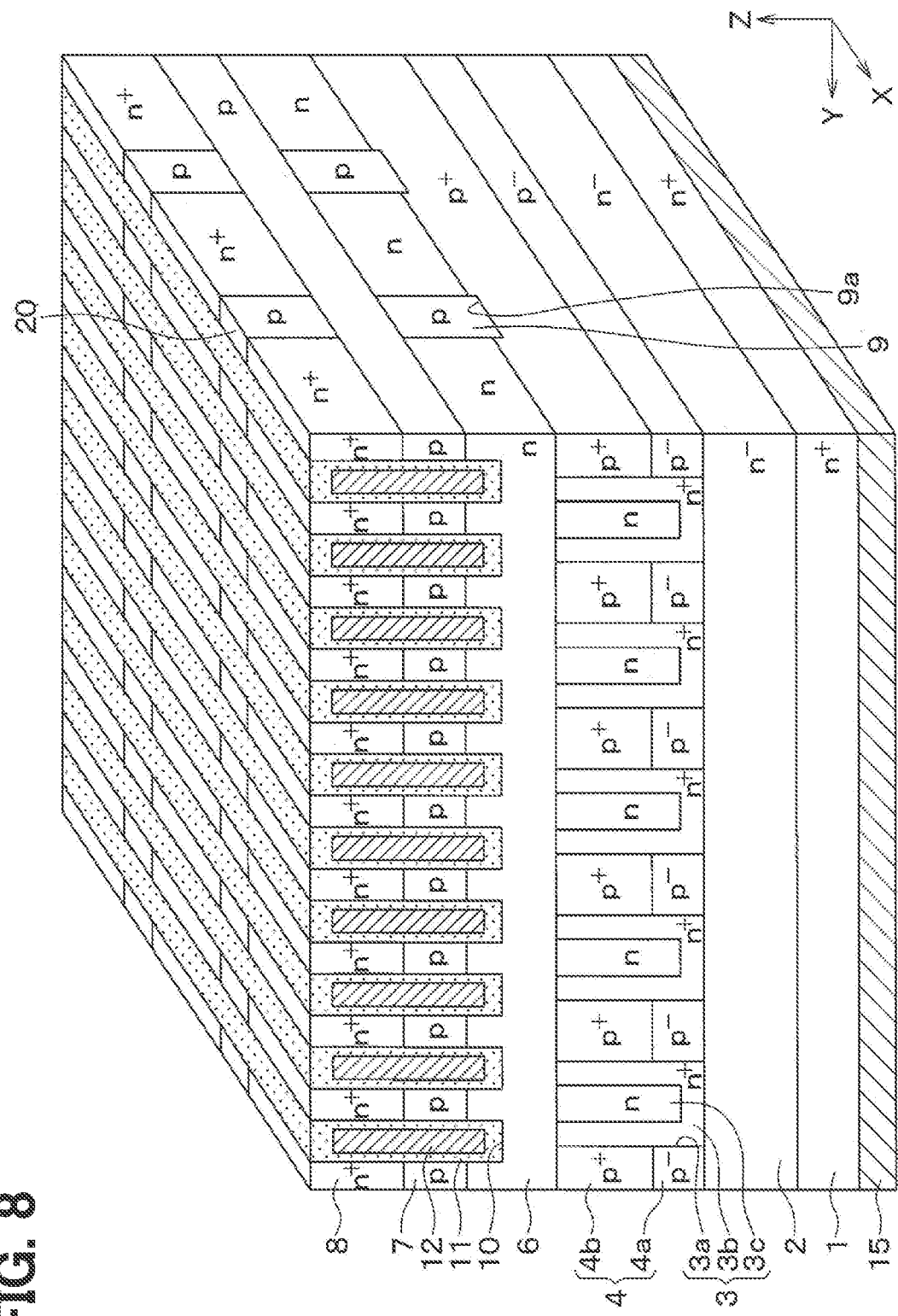
FIG. 8 is a perspective cross-sectional view illustrating a portion of an SiC semiconductor device according to the third embodiment.

As shown in FIG. 8, in the present embodiment, the n+ type layer 5 provided in the SiC semiconductor device of the first embodiment is eliminated, and the n type current dispersion layer 6 is directly formed on the JFET portion 3 and the electric field block layer 4.

In this way, a structure in which the n⁺ type layer 5 is eliminated can be obtained. Regarding the structure in which the n⁺ type layer 5 is eliminated, the structure is formed by removing the n⁺ type layer 5 and the n type layer 3c outside the trench 3a that are simultaneously formed when the n⁺ type layer 3b is formed in a flattening process such as CMP (i.e., chemical mechanical polishing) after forming the n type layer 3c. In that case, since the formation of the n type layer 3c and the formation of the n type current dispersion layer 6 are performed independently rather than continuously, the n type impurity concentrations of the n type layer 3c and the n type current dispersion layer 6 are controlled independently. Therefore, the n type impurity concentration of the n type layer 3c is set to an optimum concentration for the JFET portion 3, and the n type impurity concentration of the n type current dispersion layer 6 is set to a higher concentration, for example. These adjustments for a suitable concentration can be easily performed by a concentration control, and these can be easily manufactured.

Further, the p type connection layer 9 is formed only below the p type base region 7. Then, a p type plug layer 20 formed from the surface of the n⁺ type source region 8 is formed above the p type base region 7 so that the p type plug layer 20 is electrically connected to the source electrode 14. As described above, the p type connection layer 9 is formed only below the p type base region 7, and the p type base region 7, the p type connection layer 9, and the electric field block layer 4 are connected to the source potential through the p type plug layer 20.

The p type connection layer 9 can be formed by embedding p type SiC in the deep trench 9a after forming the deep trench 9a as described in the first embodiment. Alternatively, the layer 9 can also be formed by ion implantation. Here, when ion implantation is performed on SiC, ion implantation with a long range ion implantation requires highly accelerated ion implantation, which is not easy. For this reason, it is preferable to use a structure in which the p type connection layer 9 is formed only below the p type base region 7 as in this embodiment, because the range of ion implantation can be shortened.

The upper surface layout of the p type plug layer 20 may be arbitrary, and any structure may be used as long as the p type plug layer 20 is in contact with at least the p type base region 7. In the present embodiment, the p type plug layer 20 has a dot-like layout in which a plurality of p type plug layers 20 are arranged in the longitudinal direction of the trench gate structure.

In the method of manufacturing the SiC semiconductor device having the structure as in the present embodiment, the p type connection layer 9 is formed before the p type base region 7 is formed, and the p type plug 20 is formed after the n⁺ type source region 8 is formed. Other features are similar to the first embodiment. For the p type connection layer 9, the layer 9 is formed by performing a process of forming p type SiC so as to fill the deep trench 9a after forming the deep trench 9a as described above, or by performing a process for ion-implanting p type impurities on the n type current dispersion layer 6 is performed. Similarly, for the p type plug layer 20, the layer 20 is formed by performing a process of forming a trench with respect to the n⁺ type source region 8 and forming p type SiC so as to fill the trench, or by performing a process for ion implanting a p type impurities on the n⁺ type source region 8. When the p type connection layer 9 and the p type plug layer 20 are formed by ion implantation, the manufacturing cost may be increased, but the process stability is high and the yield ratio can be improved.

Fourth Embodiment

A fourth embodiment will be described. In this embodiment, the positional relationship between the electric field block layer 4 and the trench gate structure is specified with respect to the first to third embodiments, and the other features are similar to the first to third embodiments. Only differences from the first to third embodiments will be described. Here, although the case where this embodiment is applied with respect to the structure of first Embodiment is demonstrated, it may be applicable also to the second and third embodiment.

Figure 9:
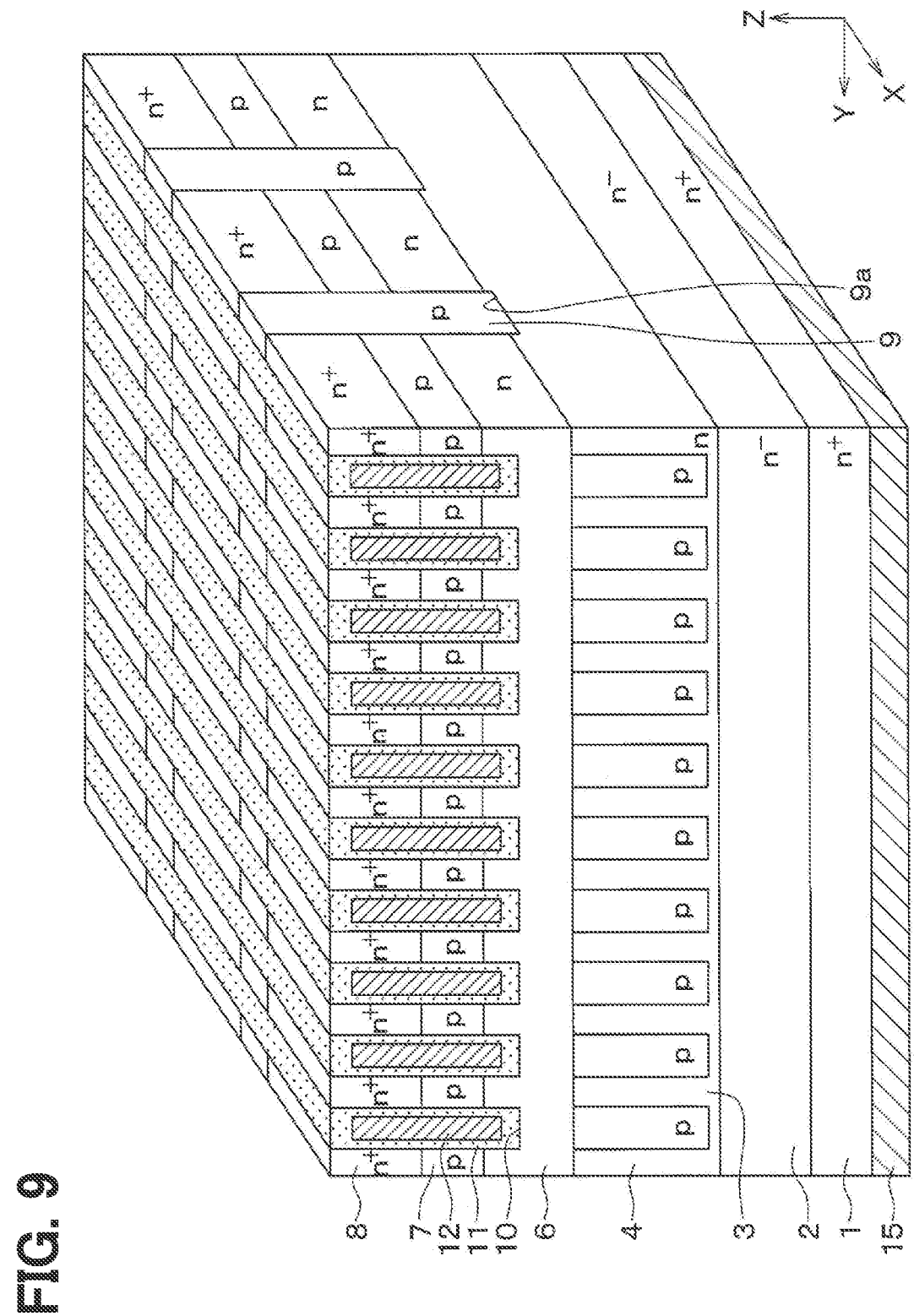
FIG. 9 is a perspective cross-sectional view illustrating a portion of an SiC semiconductor device according to the fourth embodiment.

As shown in FIG. 9, in this embodiment, the pitch of the electric field block layer 4 and the pitch of the trench gate structure are matched, and the center lines passing through the center positions thereof in the width direction are also matched. Furthermore, the width of the electric field block layer 4 is set to be equal to or larger than the width of the gate trench 10 in the trench gate structure. That is, the entire width of the trench gate structure is arranged on the electric field block layer 4, and the width of the trench gate structure is equal to or smaller than the width of the electric field block layer 4. Thus, the trench gate structure is covered by the electric field block layer 4.

The pitch and the width of the electric field block layer 4 may be arbitrarily set basically regardless of the pitch and the width of the trench gate structure. Alternatively, the gate-drain capacitance Cgd, that is, the capacitance between the gate electrode 12 and the drain electrode 15 varies depending on the layout of the electric field block layer 4.

When the drain voltage is increased, the depletion layer extending from the electric field block layer 4 to the JFET portion 3 side causes the width of the JFET portion 3 to be substantially narrowed. Finally, the JFET portion 3 is completely depleted by the depletion layer extending from the adjacent electric field block layer 4, and is pinched off. At this time, the bottom of the trench gate structure is concealed by the electric field block layer 4 and the depleted region, and a screening effect is generated. The larger the concealed area, the smaller the gate-drain capacitance Cgd.

Figure 10A:
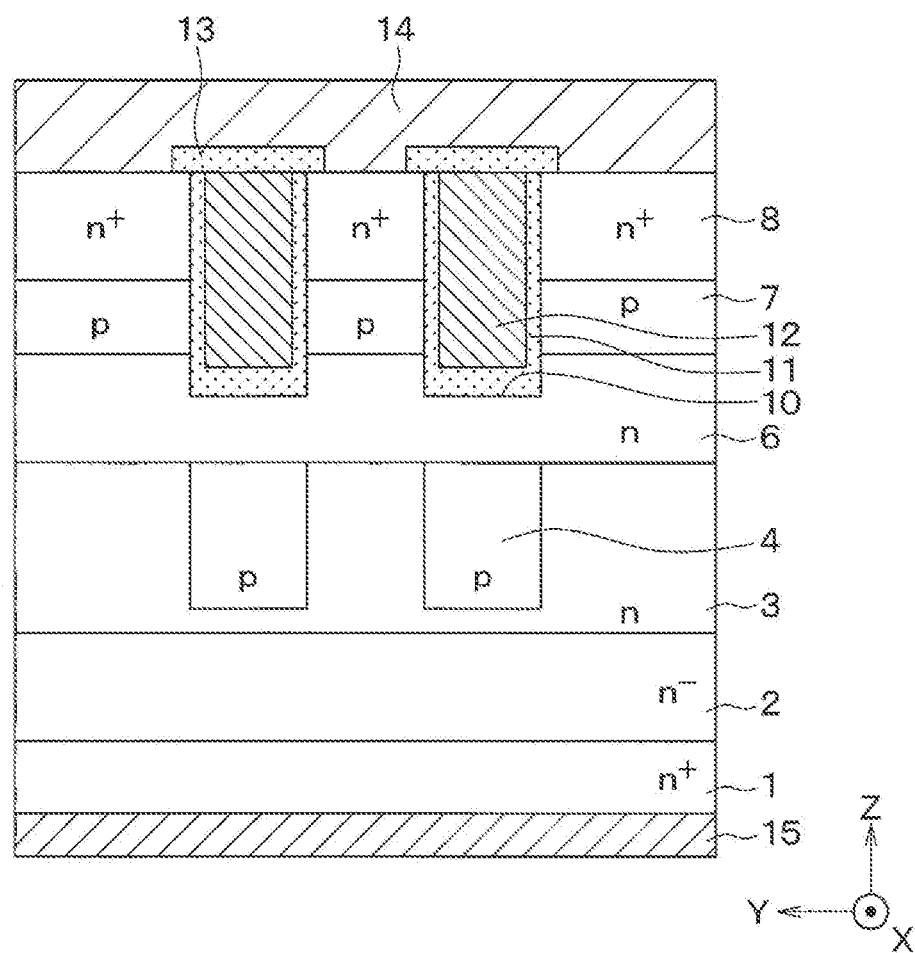
FIG. 10A is a cross-sectional view showing the structure of a MOSFET in Case I used for a simulation of a capacitance between a gate and a drain.
Figure 10B:
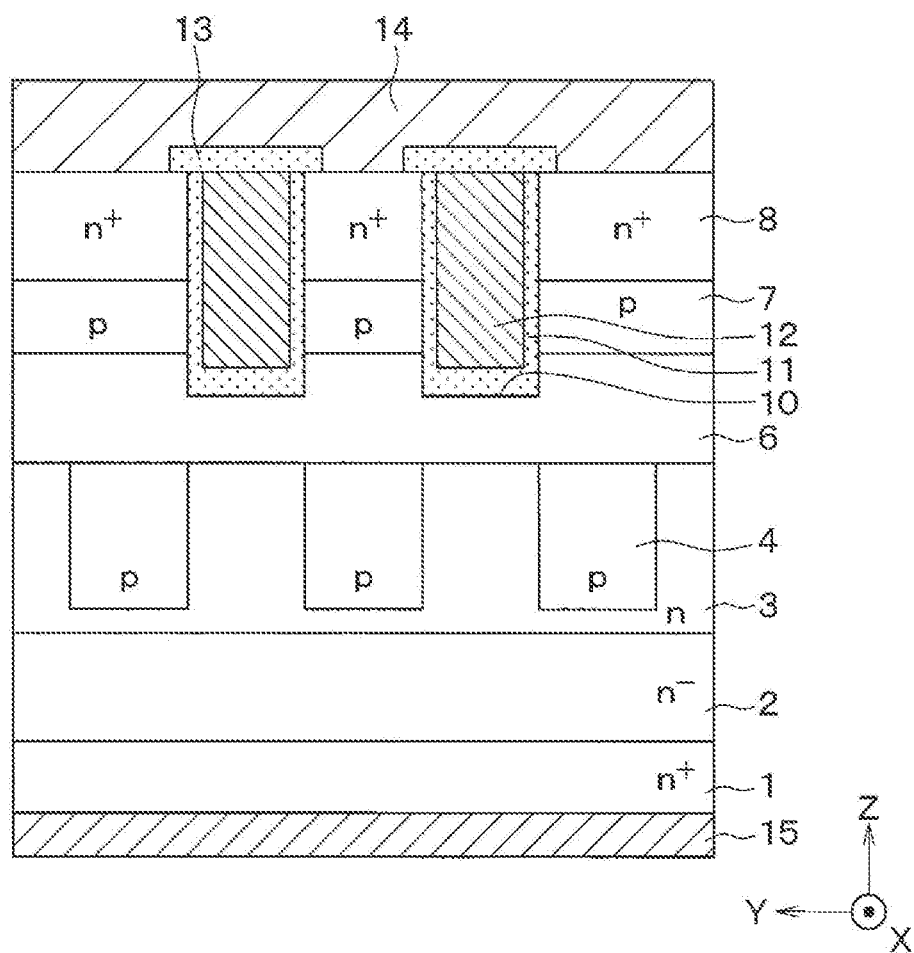
FIG. 10B is a cross-sectional view showing the structure of a MOSFET in Case II used for a simulation of a capacitance between a gate and a drain.
Figure 11:
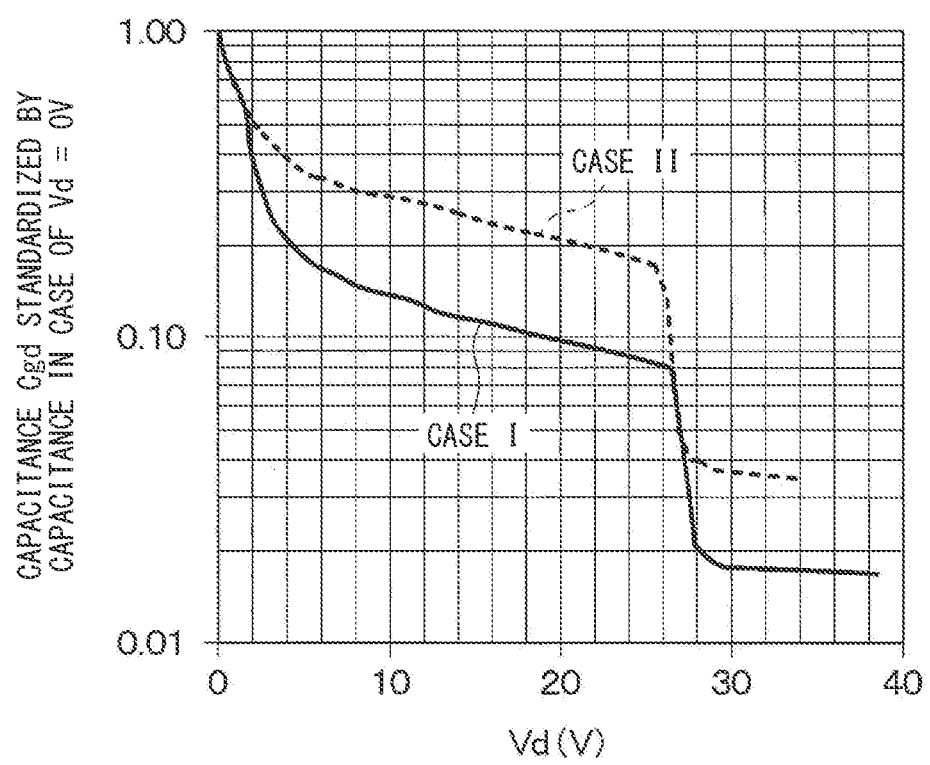
FIG. 11 is a diagram showing a simulation result of the capacitance between the gate and the drain.

For example, for each of the case I having the structure of FIG. 10A and the case II having the structure of FIG. 10B, the gate-drain capacitance Cgd is obtained by changing the drain voltage Vd, and the result shown in FIG. 11 is obtained. FIG. 10A shows a structure in which the width of the electric field block layer 4 is equal to or larger than the width of the trench gate structure, and the pitch and the centerline passing through the center position in the width direction of the trench gate structure are the same as the pitch and the centerline of the electric field block layer 4, respectively. In this case, when viewed from the drain electrode 15 side, the electric field block layer 4 completely hides the trench gate structure. In FIG. 10B, the pitch of the trench gate structure is the same as the pitch of the electric field block layer 4, but the center line passing through the center position in the width direction of the trench gate structure is shifted by ½ pitch from the center line of the electric field block layer 4, and the width of the electric field block layer 4 is the same as in FIG. 10A. In this case, when viewed from the drain electrode 15 side, the bottom of the trench gate structure is located between the electric field block layers 4, and the trench gate structure is not hidden by the electric field block layer 4. Here, in both cases I and II, the width of the electric field block layer 4 is 0.6 µm, the width of the trench gate structure is 0.6 µm, and the pitch of the electric field block layer 4 and the pitch of the trench gate structure are 1.1 µm.

As can be seen from FIG. 11, as the drain voltage Vd increases, the gate-drain capacitance Cgd decreases accordingly, and when the JFET portion 3 is pinched off, the gate-drain capacitance Cgd further decreases to be a substantially constant value. However, the gate-drain capacitance Cgd in case I is generally lower than in case II. Thus, the gate-drain capacitance Cgd can be reduced by enhancing the screening effect by hiding the bottom of the trench gate structure with the electric field block layer 4.

As described above, in the present embodiment, the pitch and the center line position of the electric field block layer 4 are matched with the pitch and the center line position of the trench gate structure, and the width of the electric field block layer 4 is equal to or larger than the width of the gate trench 10 in the trench gate structure. Thereby, the screening effect can be enhanced and the gate-drain capacitance Cgd can be reduced. The reduction in the gate-drain capacitance Cgd can shorten the charge/discharge process time for the gate, thereby improving the switching speed of the MOSFET.

Here, the center line of the electric field block layer 4 in the width direction matches with the center line of the trench gate structure in the width direction. Alternatively, it is not always necessary to match as long as the bottom of the trench gate structure is concealed by the electric field block layer 4 when viewed from the drain electrode 15 side. That is, a structure in which the entire width of the trench gate structure is arranged on the electric field block layer 4, in other words, a structure in which each part of the trench gate structure projected on a plane when viewed from the drain electrode 15 side is surrounded with each part of the electric field block layer 4 projected on the same plane when viewed from the drain electrode 15 side.

Other Embodiments

Although the present disclosure is made based on the embodiments described above, the present disclosure is not limited to such embodiments but includes various changes and modifications which are within equivalent ranges. In addition, various combinations and forms, and further, other combinations and forms including only one element, or more or less than these elements are also within the scope and the scope of the present disclosure.

(1) For example, in each of the above embodiments, the width of the striped portion of each JFET portion 3 may not be always constant. For example, the striped portion of each JFET portion 3 may have a taper shape in a cross-section so that the width thereof gradually decreases toward the drain electrode 15 side.

(2) In the second and third embodiments, the JFET portion 3 may be structured to be deeper than the electric field block layer 4.

In the first embodiment, after the electric field block layer 4 is formed, the JFET portion 3 may be formed by performing the ion implantation or by embedding the n type SiC after forming the trench. In the case of such a manufacturing method, the JFET portion 3 may be set to the same depth as the electric field block layer 4. Alternatively, it is preferable that the JFET portion 3 is deeper than the electric field block layer 4.

As described above, when the JFET portion 3 is deeper than the electric field block layer 4, it is possible to suppress the extension amount of the two-dimensional depletion layer that extends two-dimensionally from the electric field block layer 4 to the n⁻ type drift layer 2 side. That is, it is possible to further suppress the depletion layer extending from the electric field block layer 4 side into the n⁻ type drift layer 2 from entering under the JFET portion 3. For this reason, it is possible to suppress the narrowing of the current outlet in the JFET section 3 and to reduce the on-state resistance.

(3) In addition, various dimensions such as impurity concentration, thickness, width, and the like of each part constituting the SiC semiconductor device described in the above embodiments are merely examples.

For example, in each of the above embodiments, the electric field block layer 4 may be provided with a concentration gradient so that the p type impurity concentration thereof on the n⁻ type drift layer side is lower than the opposite side. For example, in the structures of the second and third embodiments, the p type impurity concentration of the p⁻ type layer 4a in the electric field block layer 4 may have a gradient. Specifically, the p type impurity concentration of the p− type layer 4a is gradually increased from the lower side to the upper side, that is, as the distance from the n⁻ type drift layer 2 side increases, and increased up to the same concentration as the p⁺ type layer 4b. In such a structure, when the p⁻ type layer 4a is formed, the introduction amount of the gas serving as the p type dopant is gradually increased, and finally increased up to the introduction amount when forming the p⁺ type layer 4b.

In the above-described embodiment, an n channel-type vertical MOSFET in which the first conductivity type is the n type and the second conductivity type is the ptype has been described as an example. Alternatively, the conductivity type of each element may be reversed so as to form a p channel-type vertical MOSFET. In the above description, the vertical MOSFET is exemplified as the semiconductor device. Alternatively, the present disclosure may be applied to an IGBT having a similar structure as that of the semiconductor device. In the case of an n-channel type IGBT, only the conductivity type of the n+ type substrate 1 is changed from the n type to the p type with respect to the embodiments described above, and other structures and manufacturing methods are the similar to those in the embodiments described above.

(5) In the above embodiments, the SiC semiconductor device is described as an example of the semiconductor device. Alternatively, the present disclosure may be applied to a semiconductor device using Si, and the embodiments described above may be applied to other wide band gap semiconductor devices, for example, a semiconductor device using GaN, diamond, AlN, or the like.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising an inversion type semiconductor element, the semiconductor element including:
    a substrate having a first conductivity type or a second conductivity type and made of semiconductor;
    a drift layer arranged on the substrate and made of semiconductor having the first conductivity type with an impurity concentration lower than the substrate;
    a saturation current suppression layer disposed on the drift layer and including: a plurality of electric field block layers made of semiconductor having the second conductivity type and arranged in a stripe pattern along one direction a longitudinal direction; and a JFET portion made of semiconductor having the first conductivity type and including a plurality of portions which are arranged in a stripe pattern and alternately arranged with the electric field block layer;
    a current dispersion layer made of semiconductor having the first conductivity type with a first conductivity type impurity concentration higher than the drift layer and arranged on the saturation current suppression layer;
    a base region made of semiconductor having the second conductivity type and disposed on the current dispersion layer;
    a source region made of semiconductor having the first conductivity type with the first conductivity type impurity concentration higher than the drift layer and disposed on the base region;
    a connection layer having the second conductivity type, extending in another direction crossing the one direction, and connecting the base region and the electric field block layer;
    a plurality of trench gate structures including: a gate trench disposed deeper than the base region from a surface of the source region; a gate insulation film covering an inner wall of the gate trench; and an gate electrode disposed on the gate insulation film, and arranged in a stripe pattern along the one direction as the longitudinal direction;
    an interlayer insulation film covering the gate electrode and the gate insulation film, and including a contact hole;
    a source electrode electrically connected to the source region through the contact hole; and
    a drain electrode disposed on a back surface of the substrate, wherein:
    a channel region is provided in a portion of the base region in contact with each trench gate structure by applying a gate voltage to the gate electrode and applying a normal operation voltage as a drain voltage to the drain electrode; and a current flows between the source electrode and the drain electrode through the source region and the JFET portion.

2. The semiconductor device according to claim 1, wherein:
    the connection layer is disposed in a deep trench that penetrates the base region and the current dispersion layer from a surface of the source region and reaches the electric field block layer; and the connection layer connects the base region and the electric field block layer, and is connected to the source electrode.

3. The semiconductor device according to claim 1, further comprising:
    a plug layer having the second conductivity type, arranged from the surface of the source region to reach the base region, disposed at a position corresponding to the connection layer, and connected to the source electrode, wherein:
    the connection layer is connected to the source electrode through the base region and the plug layer.

4. The semiconductor device according to claim 1, wherein:
    the JFET portion further includes: a trench penetrating the electric field block layer and having a bottom exposing the drift layer; a first layer disposed on the bottom and a sidewall of the trench and having the first conductivity type impurity concentration higher than the drift layer; and a second layer disposed on the first layer and having the first conductivity type impurity concentration lower than the first layer, the first layer and the second layer being disposed in the trench; and
    a channel region is provided in a portion of the base region in contact with each trench gate structure by applying a gate voltage to the gate electrode and applying a normal operation voltage as a drain voltage to the drain electrode; and a current flows between the source electrode and the drain electrode through the source region and the JFET portion.

5. The semiconductor device according to claim 4, wherein:
    the first layer provides to suppress an extension amount of a depletion layer extending from the electric field block layer to the second layer when the normal operation voltage is applied as the drain voltage, and to flow a current through the JFET portion; and the first layer provides a depletion layer adjustment layer that pinches off the JFET portion by the depletion layer when a voltage higher than the normal operation voltage is applied as the drain voltage.

6. The semiconductor device according to claim 4, wherein:
    the electric field block layer includes a lower layer disposed in contact with the drift layer, and an upper layer disposed on the lower layer and having a second conductivity type impurity concentration higher than the lower layer.

7. The semiconductor device according to claim 1, wherein:
the connection layer includes a plurality of portions arranged in a stripe pattern along the one direction;
each portion has a width in a range between 0.4 μm and 1.0 μm; and
the width is equal to or smaller than 1/30 of a distance between the portions of the connection layer.

8. The semiconductor device according to claim 7, wherein:
the distance between the plurality of portions of the connection layers is disposed in a range between 30 μm and 100 μm.

9. The semiconductor device according to claim 1, wherein:
a cell pitch defined as an interval between the trench gate structures is in a range between 0.6 μm and 2.0 μm.

10. The semiconductor device according to claim 1, wherein:
the JFET portion has a dimension in an arrangement direction in which the plurality of portions of the JFET portion are arranged; and
the dimension is in a range between 0.6 μm and 2.0 μm.

11. The semiconductor device according to claim 1, wherein:
a pitch of the electric field block layer is equal to a pitch of the trench gate structure;
a width of the electric field block layer is equal to or greater than a width of the trench gate structure; and
a whole of the trench gate structure in a width direction is arranged above the electric field block layer.

12. A method for manufacturing a semiconductor device including an inversion type semiconductor element, the method comprising:
preparing a substrate made of semiconductor having a first conductivity type or a second conductivity type;
forming a drift layer, made of semiconductor having the first conductivity type with an impurity concentration lower than the substrate, on the substrate;
forming a saturation current suppression layer, including: a plurality of electric field block layers made of semiconductor having the second conductivity type and arranged in a stripe pattern along one direction a longitudinal direction; and a JFET portion made of semiconductor having the first conductivity type and including a plurality of portions which are arranged in a stripe pattern and alternately arranged with the electric field block layer, on the drift layer;
forming a current dispersion layer, made of semiconductor having the first conductivity type with a first conductivity type impurity concentration higher than the drift layer, on the saturation current suppression layer;
forming a base region, made of semiconductor having the second conductivity type, on the current dispersion layer;
forming a source region, made of semiconductor having the first conductivity type with the first conductivity type impurity concentration higher than the drift layer, on the base region;
forming a deep trench that penetrates the base region and the current dispersion layer from a surface of the source region, reaches the electric field block layer, and has a longitudinal direction crossing the one direction;
forming a connection layer, having the second conductivity type, and connecting the base region and the electric field block layer, in the deep trench;
forming a plurality of trench gate structures by forming a plurality of gate trenches, deeper than the base region from a surface of the source region and the connection layer, in a stripe pattern along the one direction as the longitudinal direction, then, by forming a gate insulation film on an inner wall of each gate trench, and by forming an gate electrode on the gate insulation film;
forming a source electrode electrically connected to the source region; and
forming a drain electrode on a back surface of the substrate.

13. The method for manufacturing a semiconductor device according to claim 12, wherein:
the forming of the saturation current suppression layer includes: forming a first layer (3b), having the first conductivity type impurity concentration higher than the drift layer, on a bottom and a sidewall of a trench, which is formed in the electric field block layer; and
forming a second layer, having the first conductivity type impurity concentration lower than the first layer, on the first layer, the first layer and the second layer providing the JFE portion.

14. The method for manufacturing a semiconductor device according to claim 13, wherein:
the forming of the saturation current suppression layer further includes: epitaxially growing a lower layer in contact with the drift layer; and epitaxially growing an upper layer, having a second conductivity type impurity concentration higher than the lower layer, on the lower layer, the lower layer and the upper layer providing the electric field block layer.

15. The method for manufacturing a semiconductor device according to claim 13, wherein:
forming of the JFET portion in the forming of the saturation current suppression layer and the forming of the current dispersion layer are performed continuously;
the first layer and the second layer are epitaxially grown successively; and
the current dispersion layer is epitaxially grown at a same time of an epitaxial growth of the second layer.

16. The method for manufacturing a semiconductor device according to claim 12, wherein:
the forming of the trench gate structures, a pitch of trench gate structures is set to be equal to a pitch of the electric field block layer, and a width of each trench gate structure is set to be equal to or smaller than a width of the electric field block layer; and
a whole of the trench gate structure in a width direction is arranged above the electric field block layer.

17. A method for manufacturing a semiconductor device including an inversion type semiconductor element, the method comprising:
preparing a substrate made of semiconductor having a first conductivity type or a second conductivity type;
forming a drift layer, made of semiconductor having the first conductivity type with an impurity concentration lower than the substrate, on the substrate;
forming a saturation current suppression layer, including: a plurality of electric field block layers made of semiconductor having the second conductivity type and arranged in a stripe pattern along one direction a longitudinal direction; and a JFET portion made of semiconductor having the first conductivity type and including a plurality of portions which are arranged in a stripe pattern and alternately arranged with the electric field block layer, on the drift layer;

forming a current dispersion layer, made of semiconductor having the first conductivity type with a first conductivity type impurity concentration higher than the drift layer, on the saturation current suppression layer;
forming a connection layer having the second conductivity type, extending in another direction crossing the one direction, and reaching the electric field block layer by ion implanting the second conductivity type impurity on the current dispersion layer;
forming a base region, made of semiconductor having the second conductivity type, on the current dispersion layer and the connection layer;
forming a source region, made of semiconductor having the first conductivity type with the first conductivity type impurity concentration higher than the drift layer, on the base region;
forming a plug layer having the second conductivity type and reaching the base region by ion implanting the second conductivity type impurity on the source region;
forming a plurality of trench gate structures by forming a plurality of gate trenches, deeper than the base region from a surface of the source region and the connection layer, in a stripe pattern along the one direction as the longitudinal direction, then, by forming a gate insulation film on an inner wall of each gate trench, and by forming an gate electrode on the gate insulation film;
forming a source electrode electrically connected to the source region; and
forming a drain electrode on a back surface of the substrate.

* * * * *